United States Patent
Takahashi

(10) Patent No.: US 10,859,632 B2
(45) Date of Patent: Dec. 8, 2020

(54) SECONDARY BATTERY SYSTEM AND SOC ESTIMATION METHOD FOR SECONDARY BATTERY

(71) Applicant: TOYOTA JIDOSHA KABUSHIKI KAISHA, Toyota-shi, Aichi-ken (JP)

(72) Inventor: Kenji Takahashi, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 134 days.

(21) Appl. No.: 16/157,320

(22) Filed: Oct. 11, 2018

(65) Prior Publication Data

US 2019/0178948 A1    Jun. 13, 2019

(30) Foreign Application Priority Data

Dec. 12, 2017   (JP) .................................. 2017-237881

(51) Int. Cl.
  *G01R 31/374*   (2019.01)
  *G01R 31/367*   (2019.01)
  *G01R 31/3842*  (2019.01)

(52) U.S. Cl.
  CPC ......... *G01R 31/374* (2019.01); *G01R 31/367* (2019.01); *G01R 31/3842* (2019.01)

(58) Field of Classification Search
  CPC . G01R 31/367; G01R 31/374; G01R 31/3842
  USPC ........................................................ 324/431
  See application file for complete search history.

(56) References Cited

U.S. PATENT DOCUMENTS

| 2015/0253389 A1* | 9/2015 | Arai ................... G01R 31/3828 324/427 |
| 2015/0355285 A1 | 12/2015 | Nishigaki et al. |
| 2016/0195589 A1* | 7/2016 | Hanyu ................ G01R 31/367 702/63 |

FOREIGN PATENT DOCUMENTS

| JP | 2013-158087 A | 8/2013 |
| JP | 2014-139521 A | 7/2014 |
| JP | 2015-166710 A | 9/2015 |

OTHER PUBLICATIONS

V. A. Sethuraman et al: "In Situ Measurements of Stress-Potential Coupling in Lithiated Silicon", Journal of the Electrochemical Society, 157 (11) A1253-A1261 (2010).

* cited by examiner

*Primary Examiner* — Nasima Monsur
*Assistant Examiner* — Rahul Maini
(74) *Attorney, Agent, or Firm* — Sughrue Mion, PLLC

(57) ABSTRACT

A secondary battery system includes: a secondary battery having an electrode containing an active material; and an electronic control unit configured to execute an SOC estimation process of estimating an SOC of the secondary battery. The electronic control unit is configured to: i) calculate the surface stress from a use history of the secondary battery; ii) calculate the amount of change in OCV from the calculated surface stress iii) correct an estimated OCV with the use of the amount of change in OCV; the estimated OCV being estimated from a voltage value and current value of the secondary battery; and iv) estimate an SOC corresponding to the corrected estimated OCV as the SOC of the secondary battery.

6 Claims, 20 Drawing Sheets

SECONDARY BATTERY SYSTEM AND SOC ESTIMATION METHOD FOR SECONDARY BATTERY

INCORPORATION BY REFERENCE

The disclosure of Japanese Patent Application No. 2017-237881 filed on Dec. 12, 2017 including the specification, drawings and abstract is incorporated herein by reference in its entirety.

BACKGROUND

1. Technical Field

The disclosure relates to a secondary battery system and an SOC estimation method for a secondary battery.

2. Description of Related Art

Highly accurate estimation of the SOC of a secondary battery is important in terms of appropriately protecting the secondary battery and making full use of the secondary battery. There is a technique for estimating an SOC from an OCV with the use of an SOC-OCV curve for a secondary battery as a typical technique for estimating the SOC of a secondary battery.

Among secondary batteries, there is a system having a remarkable gap between an SOC-OCV curve (or a discharge OCV on a curve DCH which will be described later) that is obtained when a secondary battery discharges from a fully charged state and an SOC-OCV curve (or a charge OCV on a curve CHG which will be described later) that is obtained when the secondary battery is charged from a fully discharged state. Such a gap between the discharge OCV and the charge OCV is also called a hysteresis in the SOC-OCV curves. For example, Japanese Unexamined Patent Application Publication No. 2015-166710 (JP 2015-166710 A) describes a technique for estimating an SOC from an OCV after taking a hysteresis into consideration.

SUMMARY

Stresses can occur at the surface and inside of an electrode active material of a secondary battery. These stresses are respectively called surface stress and internal stress. The present disclosure focused on the point that a hysteresis appears in the relation between an SOC and an OCV due to a surface stress and there is a correspondence relation between a surface stress and a magnitude of the hysteresis. The technique described in JP 2015-166710 A is silent on surface stress, so there is room for improvement in SOC estimation accuracy.

Here, the OCV means a voltage measured in a state where a secondary battery has been sufficiently rested (for example, in a lithium ion secondary battery, a state where polarization is relaxed and the concentration of lithium in an active material is relaxed). The OCV may also be called an electromotive force.

The disclosure provides a secondary battery system that improves SOC estimation accuracy in estimating an SOC from an OCV with the use of a correspondence relation between an SOC and OCV of a secondary battery.

The disclosure also provides an SOC estimation method that improves SOC estimation accuracy in estimating an SOC from an OCV with the use of a correspondence relation between an SOC and OCV of a secondary battery.

An aspect of the present disclosure relates to a secondary battery system including: a secondary battery including an electrode, the electrode containing an active material; and an electronic control unit configured to execute an SOC estimation process of estimating SOC of the secondary battery with the use of a first correspondence relation and a second correspondence relation, the first correspondence relation being a correspondence relation between OCV and the SOC of the secondary battery in a case where a surface stress of the active material is a reference stress, the second correspondence relation being a correspondence relation between the surface stress and an amount of change in the OCV with reference to OCV in the case where the surface stress is the reference stress, the amount of change in the OCV being caused by the surface stress of the active material, wherein, in the SOC estimation process, the electronic control unit is configured to: i) calculate the surface stress from a use history of the secondary battery; ii) calculate the amount of change in the OCV from the calculated surface stress by consulting the second correspondence relation; iii) correct an estimated OCV by using the amount of change in the OCV, the estimated OCV being estimated from a voltage value and a current value of the secondary battery; and iv) estimate SOC corresponding to the corrected estimated OCV as the SOC of the secondary battery by consulting the first correspondence relation.

According to the above aspect, an SOC is estimated in consideration of hysteresis of an OCV due to a surface stress with the use of the first and second correspondence relations (described in detail later). Thus, for example, even when an active material of which the amount of volume change resulting from charging or discharging is large is used for an electrode, it is possible to highly accurately estimate an SOC.

In the above aspect, the electronic control unit may be configured to repeatedly execute the SOC estimation process. The use history may include a temperature of the secondary battery, a current input to or output from the secondary battery, an amount of change in the SOC of the secondary battery, and SOC of the secondary battery estimated in a last SOC estimation process.

In the above aspect, the electronic control unit may be configured to repeatedly execute the SOC estimation process. The use history may include a temperature of the secondary battery, an amount of electric charge that has been charged into or discharged from the secondary battery from a time when a combination of SOC and OCV of the secondary battery deviates from any one of a charge curve and discharge curve of the secondary battery, and SOC of the secondary battery estimated in a last SOC estimation process.

In the above aspect, the SOC of the secondary battery is a parameter that indicates the amount of charge carrier (for example, lithium content) inside the active material. A current input to or output from the secondary battery, an amount of change in SOC of the secondary battery, and the amount of electric charge are parameters that indicate a mode of insertion or desorption of charge carrier inside the active material. By calculating a surface stress based on these parameters, it is possible to highly accurately estimate a surface stress. As a result, it is possible to improve SOC estimation accuracy.

In the above aspect, the electronic control unit may include a memory which stores the use history. The electronic control unit may be configured to calculate the surface stress by using the use history stored in the memory within a predetermined period from execution of the SOC estimation process.

According to the above aspect, a use history stored in the memory within the predetermined period from execution of the SOC estimation process (the latest use history) is used. In other words, a use history before the predetermined period (old use history) is not used. Since the influence of a use history before the predetermined period on a surface stress is relatively small, it is possible to highly accurately estimate a surface stress with the use of only a use history within the predetermined period. Since the amount of use history that is stored in the memory is reduced, an electronic control unit (for example, an onboard electronic control unit) having a relatively low throughput is also able to suitably execute the SOC estimation process.

In the above aspect, the active material may include a first active material and a second active material. An amount of volume change of the second active material resulting from charging or discharging of the secondary battery may be larger than an amount of volume change of the first active material resulting from charging or discharging of the secondary battery. A first SOC range and a second SOC range may exist in a correspondence relation between the OCV and the SOC of the secondary battery, hysteresis of the OCV of the secondary battery resulting from charging and discharging of the secondary battery in the second SOC range being larger than hysteresis of the OCV of the secondary battery resulting from charging and discharging of the secondary battery in the first SOC range. The electronic control unit may be configured to: i) repeatedly estimate the SOC of the secondary battery; ii) when the SOC of the secondary battery, estimated last time, falls within the second SOC range, execute the SOC estimation process; and iii) when the SOC of the secondary battery, estimated last time, falls within the first SOC range, estimate the SOC of the secondary battery in accordance with a relation between the OCV and the SOC, the relation between the OCV and the SOC being other than the first correspondence relation or the second correspondence relation.

According to the above aspect, an SOC is estimated through the SOC estimation process in the second SOC range in which hysteresis of an OCV significantly appears, and an SOC is estimated with a technique other than the SOC estimation process (specifically, for example, a technique using a normal SOC-OCV curve is used) in the first SOC range in which no significant hysteresis appears. Since the SOC estimation process can require large computational resource, it is possible to reduce the computational resource of the electronic control unit by using the normal technique in the first SOC range.

Another aspect of the present disclosure relates to an SOC estimation method for a secondary battery including an active material in an electrode of the secondary battery, including: calculating a surface stress of the active material from a use history of the secondary battery; calculating an amount of change in OCV of the secondary battery from the calculated surface stress by consulting a first correspondence relation, the first correspondence relation being a correspondence relation between the surface stress and an amount of change in the OCV with reference to OCV in a case where the surface stress is a reference stress, the amount of change in the OCV being caused by the surface stress; correcting an estimated OCV by using the amount of change in OCV, the estimated OCV being estimated from a voltage value and a current value of the secondary battery; and estimating SOC corresponding to the corrected estimated OCV as SOC of the secondary battery by consulting a second correspondence relation, the second correspondence relation being a correspondence relation between OCV and SOC of the secondary battery in the case where the surface stress is the reference stress.

According to the above aspect, as in the case of the above-described configuration, even when an active material of which the amount of volume change resulting from charging or discharging is large is used for an electrode, it is possible to highly accurately estimate an SOC.

According to the disclosure, it is possible to improve SOC estimation accuracy.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
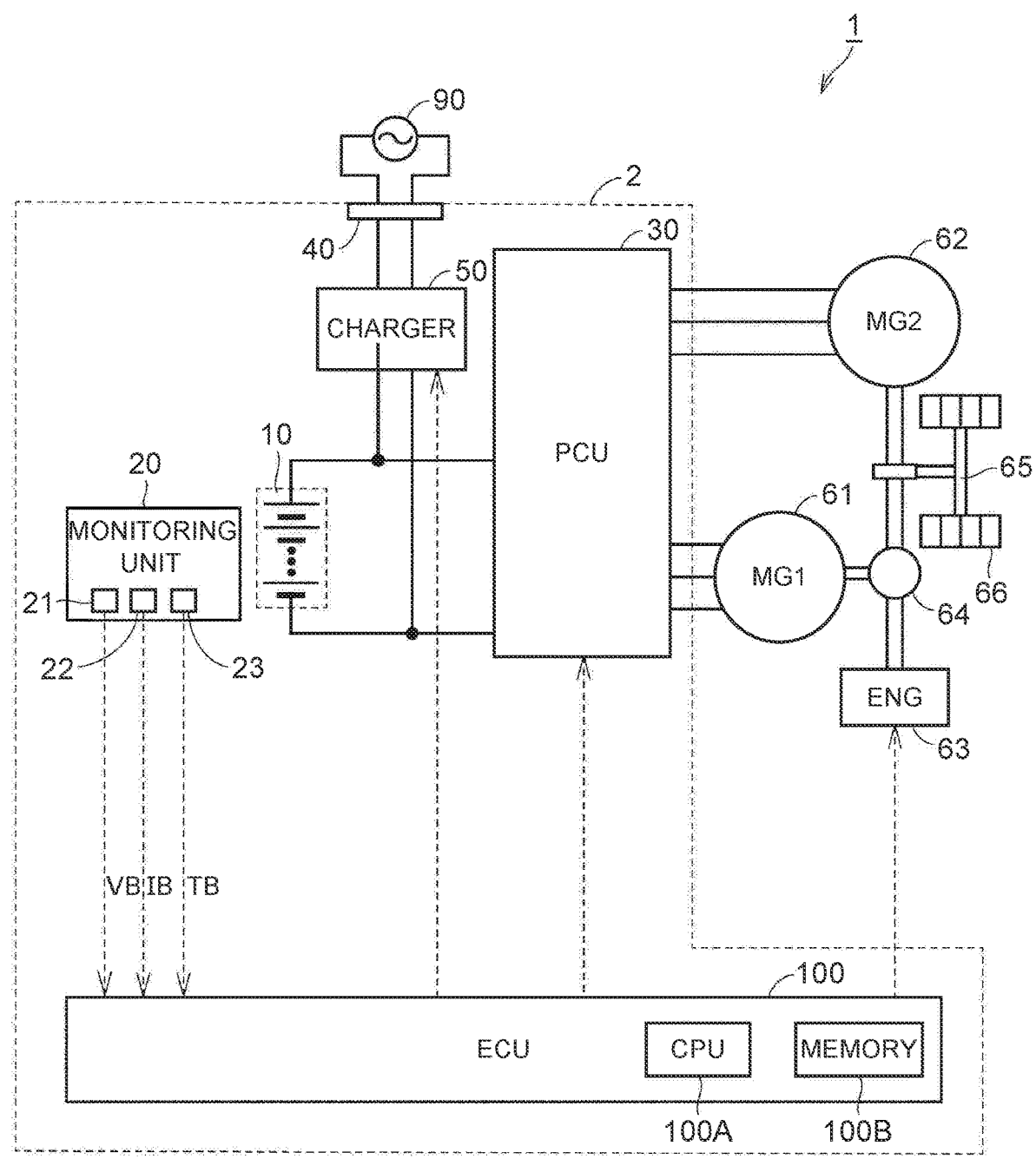
FIG. 1 is a drawing that schematically shows the overall configuration of a vehicle on which a secondary battery system according to a first embodiment is mounted.

Hereinafter, an embodiment of the disclosure will be described in detail with reference to the accompanying drawings. Like reference numerals denote the same or corresponding portions in the drawings, and the description thereof is not repeated.

Hereinafter, a configuration in which a secondary battery system according to the present embodiment is mounted on a hybrid vehicle (more specifically, a plug-in hybrid vehicle) will be described as an example. However, the secondary battery system according to the present embodiment is not limited to a hybrid vehicle. The secondary battery system according to the present embodiment is applicable to any vehicle (such as an electric vehicle and a fuel cell vehicle) on which a battery pack for providing driving power for the vehicle is mounted. In addition, the use of the secondary battery system according to the present embodiment is not limited to a use for a vehicle, and the use of the battery system according to the present embodiment may be, for example, a use for a stationary device.

First Embodiment

Configuration of Secondary Battery System

FIG. 1 is a view that schematically shows the overall configuration of a vehicle on which a secondary battery system according to a first embodiment is mounted. As shown in FIG. 1, the vehicle 1 is a hybrid vehicle, and includes the secondary battery system 2, motor generators 61, 62, an engine 63, a power split device 64, a drive shaft 65, and drive wheels 66. The secondary battery system 2 includes a battery pack 10, a monitoring unit 20, a power control unit (PCU) 30, an inlet 40, a charger 50, and an electronic control unit (ECU) 100.

Each of the motor generators 61, 62 is an alternating-current rotary electric machine, and is, for example, a three-phase alternating-current synchronous motor in which permanent magnets are embedded in a rotor. The motor generator 61 is mainly used as a generator that is driven by the engine 63 via the power split device 64. Electric power generated by the motor generator 61 is supplied to the motor generator 62 or the battery pack 10 via the PCU 30.

The motor generator 62 mainly operates as an electric motor, and drives the drive wheels 66. The motor generator 62 is driven with at least one of electric power from the battery pack 10 and electric power generated by the motor generator 61. The driving force of the motor generator 62 is transmitted to the drive shaft 65. On the other hand, during braking of the vehicle or during reduction in acceleration on a descending slope, the motor generator 62 operates as a generator and performs regenerative power generation. The electric power generated by the motor generator 62 is supplied to the battery pack 10 via the PCU 30.

The engine 63 is an internal combustion engine that outputs power by converting combustion energy to kinetic energy. The combustion energy is generated when a mixture of air and fuel is burned. The kinetic energy is the energy of a movable element, such as a piston and a rotor.

The power split device 64 includes, for example, a planetary gear train (not shown) including three rotary shafts each of which corresponds to a sun gear, a carrier, and a ring gear respectively. The power split device 64 splits power, which is output from the engine 63, into power for driving the motor generator 61 and power for driving the drive wheels 66.

Figure 2:
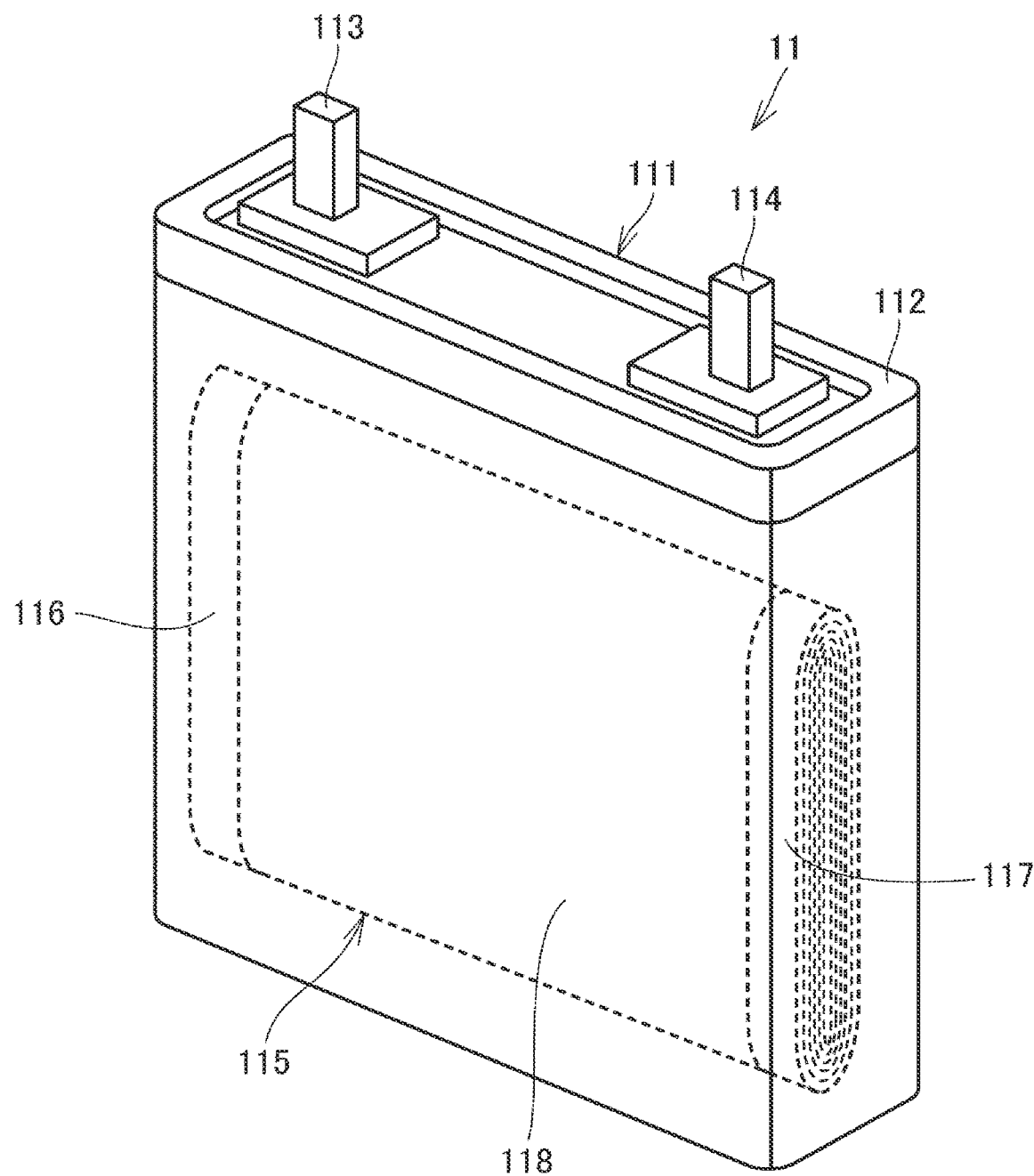
FIG. 2 is a perspective view for illustrating the configuration of each cell in more detail.

The battery pack 10 includes a plurality of cells 11 (see FIG. 2). In the present embodiment, each cell is a lithium ion secondary battery. The battery pack 10 stores electric power for driving the motor generator 61 or the motor generator 62, and supplies electric power to the motor generator 61 or the motor generator 62 through the PCU 30. The battery pack 10 is charged with generated electric power through the PCU 30 during power generation of the motor generator 61 or motor generator 62.

The monitoring unit 20 includes a voltage sensor 21, a current sensor 22, and a temperature sensor 23. The voltage sensor 21 detects the voltage of each of the cells 11 included in the battery pack 10. The current sensor 22 detects the current IB that is input to or output from the battery pack 10. The current IB is positive during charging, and the current IB is negative during discharging. The temperature sensor 23 detects the temperature of each of the cells 11. Each of the sensors outputs the corresponding detected result to the ECU 100.

Alternatively, the voltage sensor 21 may, for example, detect the voltage VB of a plurality of the cells 11 connected in series with each other as a unit for monitoring. Alternatively, the temperature sensor 23 may detect the temperature TB of a plurality of the adjacent cells 11 as a unit for monitoring. In this way, in the present embodiment, a unit for monitoring is not specifically limited. Thus, for the sake of simple description below, these are simply described as detecting the voltage VB of the battery pack 10 or detecting the temperature TB of the battery pack 10. Similarly, for an SOC and an OCV, the battery pack 10 is described as a unit for estimation.

The PCU 30 bidirectionally converts electric power between the battery pack 10 and each of the motor generators 61, 62 in accordance with a control signal from the ECU 100. The PCU 30 is configured to be able to separately control the statuses of the motor generators 61, 62. For example, the PCU 30 is able to set the motor generator 62 in a power running state while setting the motor generator 61 in a regenerative state (power generation state). The PCU 30 includes, for example, two inverters and a converter (all of which are not shown). The two inverters are provided in correspondence with the motor generators 61, 62. The converter steps up direct-current voltage, which is supplied to each inverter, to a voltage higher than or equal to the output voltage of the battery pack 10.

The inlet 40 is configured to allow connection of a charging cable. The inlet 40 receives electric power, which is supplied from a power supply 90, via the charging cable. The power supply 90 is provided outside the vehicle 1. The power supply 90 is, for example, a commercial power supply.

The charger 50 converts electric power, supplied from the power supply 90 via the charging cable and the inlet 40, to electric power suitable for charging of the battery pack 10 in accordance with a control signal from the ECU 100. The charger 50 includes, for example, an inverter and a converter (both are not shown).

The ECU 100 includes a central processing unit (CPU) 100A, a memory (more specifically, a read only memory (ROM) and a random access memory (RAM)) 100B, and input/output ports (not shown) for inputting and outputting various signals. The ECU 100 executes an SOC estimation process based on signals that are received from the sensors of the monitoring unit 20 and programs and maps stored in the memory 100B. In the SOC estimation process, the SOC of the battery pack 10 is estimated. The ECU 100 controls charging and discharging of the battery pack 10 in accordance with a result of the SOC estimation process. The SOC estimation process will be described in detail later. The ECU 100 corresponds to an example of an "electronic control unit" according to the disclosure.

FIG. 2 is a view for illustrating the configuration of each cell 11 in more detail. The inside of the cell 11 is seen through in FIG. 2.

As shown in FIG. 2, the cell 11 has a square (substantially rectangular parallelepiped) battery case 111. The top face of the battery case 111 is closed by a lid 112. One end of each of a positive electrode terminal 113 and a negative electrode terminal 114 protrudes outward from the lid 112. The other ends of the positive electrode terminal 113 and negative electrode terminal 114 are respectively connected to an internal positive electrode terminal and an internal negative electrode terminal (both are not shown) inside the battery case 111. An electrode element 115 is accommodated inside the battery case 111. The electrode element 115 is formed by laminating a positive electrode 116 and a negative electrode 117 via a separator 118 and rolling the laminated body. An electrolyte is held in the positive electrode 116, the negative electrode 117, the separator 118, and the like.

Many kinds of components and materials may be used as a positive electrode, separator and electrolyte of a lithium ion secondary battery for the positive electrode 116, the separator 118 and the electrolyte. As an example, a ternary material in which part of lithium cobaltate is replaced by nickel and manganese may be used for the positive electrode 116. A polyolefin (for example, polyethylene or polypropylene) may be used for the separator 118. The electrolyte contains an organic solvent (for example, a mixed solvent of dimethyl carbonate (DMC), ethyl methyl carbonate (EMC), and ethylene carbonate (EC)), a lithium salt (for example, $LiPF_6$), an additive (for example, lithium bis(oxalate)borate (LiBOB) or $Li[PF_2(C_2O_4)_2]$), and the like.

The configuration of the cell 11 is not specifically limited. The electrode element 115 does not need to have a rolled structure, and may have a laminated structure. The battery case 111 is not limited to a square battery case. A cylindrical or laminated battery case may also be employed.

An related art in which typical negative electrode active material of a lithium ion secondary battery is a carbon material (for example, graphite) may exist. In contrast, in the present embodiment, a silicon-based compound (Si or SiO) is employed as an active material of the negative electrode 117. This is because it is possible to increase the energy density, and the like, of the battery pack 10 by employing a silicon-based compound. On the other hand, in a system in which a silicon-based compound is employed, hysteresis can remarkably appear in SOC-OCV characteristics (SOC-OCV curve). As will be described below, factors of the hysteresis presumably include a volume change of the negative electrode active material resulting from charging or discharging.

Hysteresis of SOC-OCV Curve

The negative electrode active material expands with insertion of lithium, and shrinks with desorption of lithium. With such a volume change of the negative electrode active material, stresses occur at the surface and inside of the negative electrode active material. The amount of volume change of a silicon-based compound resulting from insertion or desorption of lithium is larger than the amount of volume change of graphite. Specifically, when a minimum volume in a state where lithium is not inserted is set for a reference, the amount of volume change (expansion coefficient) of graphite resulting from insertion of lithium is approximately 1.1 times, while the amount of volume change of the silicon-based compound is up to approximately four times. For this reason, when a silicon-based compound is employed as the negative electrode active material, a stress that occurs at the surface of the negative electrode active material increases as compared to when graphite is employed as the negative electrode active material. Hereinafter, this stress is also referred to as surface stress.

Generally, a monopole potential (a positive electrode potential or a negative electrode potential) is determined based on the condition of an active material surface, more specifically, a lithium content and surface stress at the active material surface. For example, it is known that the negative electrode potential decreases with an increase in lithium content at the negative electrode active material surface. When a material that exhibits a large volume change such as a silicon-based compound is employed, the amount of change in surface stress resulting from a variation in lithium content also increases. The surface stress has hysteresis. Thus, by taking the influence of the surface stress and its hysteresis into consideration, it is possible to highly accurately define the negative electrode potential. When an SOC is estimated from an OCV with the use of the relation between an SOC and an OCV, it is possible to highly accurately estimate an SOC on the assumption of a negative electrode potential under the situation in which the surface stress is taken into consideration in that way.

As described above, the OCV means a voltage in a state where the voltage of the battery pack 10 is sufficiently relaxed and the concentration of lithium in the active material is relaxed. A stress remaining at the negative electrode surface in this relaxation state may be regarded as a stress at the time when various forces including a stress that occurs inside the negative electrode active material, a counteracting force that acts on the negative electrode active material from peripheral materials as a result of a volume change of the negative electrode active material, and the like, balance in the system as a whole. The peripheral materials include a binder, a conductive agent, and the like.

Figure 3:
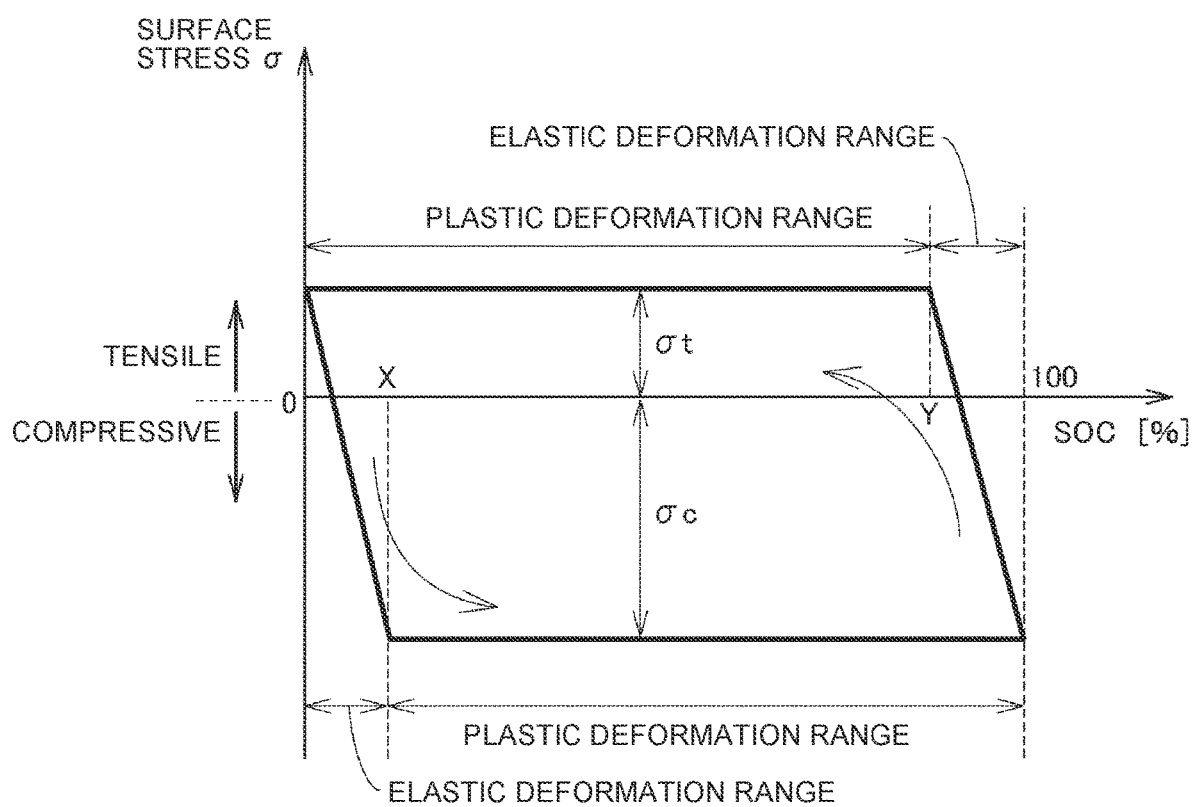
FIG. 3 is a graph that schematically shows an example of a variation in surface stress resulting from charging and discharging of a battery pack.

FIG. 3 is a graph that schematically shows an example of a variation in surface stress $\sigma$ resulting from charging and discharging of the battery pack 10. In FIG. 3, the abscissa axis represents the SOC of the battery pack 10, and the ordinate axis represents a surface stress $\sigma$. As for the surface stress $\sigma$, a tensile stress that occurs during shrinkage of the negative electrode active material (during discharging of the battery pack 10) is indicated in a positive direction, and a compressive stress that occurs during expansion of the negative electrode active material (during charging of the battery pack 10) is indicated in a negative direction.

FIG. 3 schematically shows an example of a variation in surface stress $\sigma$ in the case where the battery pack 10 is charged at a constant charging rate from a fully discharged state (a state where the SOC is 0%) to a fully charged state (a state where the SOC is 100%) and then the battery pack 10 is discharged at a constant discharging rate from the fully charged state to the fully discharged state.

Just after the start of charging from the fully discharged state, (the absolute value of) the surface stress $\sigma$ linearly increases. In this SOC range during charging (the range from 0% of the SOC to X of the SOC), it is presumable that the surface of the negative electrode active material is elastically deformed. In contrast, in a range thereafter (the range from X of the SOC to 100% of the SOC), it is presumable that the surface of the negative electrode active material plastically deforms beyond elastic deformation. On the other hand, during discharging of the battery pack 10, it is presumable that the surface of the negative electrode active material elastically deforms in a range just after the start of discharging from the fully charged state (the range from 100% of the SOC to Y of the SOC) and the surface of the negative electrode active material plastically deforms in a range thereafter (the range from Y of the SOC to 0% of the SOC).

In FIG. 3, the entire variation in surface stress σ is shown by the straight lines. However, this just schematically shows a variation in surface stress σ. Actually, there is also a non-linear variation (see, for example, FIG. 2 of "In Situ Measurements of Stress-Potential Coupling in Lithiated Silicon", V. A. Sethuraman, et al., Journal of The Electrochemical Society, 157 (11) A1253-A1261 (2010)). FIG. 3 shows an example of the case where the SOC is varied from 0% to 100%. However, the SOC range is not limited to this range. Although not shown in the graph, when the OCV of the battery pack 10 deviates from a charge OCV or discharge OCV (described later), the surface of the negative electrode active material elastically deforms.

During continuous charging of the battery pack 10, mainly, a compressive stress acts at the negative electrode active material surface (the surface stress σ is a compressive stress), and the negative electrode potential decreases as compared to an ideal state where no surface stress σ is occurring. As a result, the OCV of the battery pack 10 increases. On the other hand, during continuous discharging of the battery pack 10, mainly, a tensile stress acts at the negative electrode active material surface (the surface stress σ is a tensile stress), and the negative electrode potential increases as compared to the ideal state. As a result, the OCV of the battery pack 10 decreases. In accordance with the above mechanism, hysteresis resulting from charging and discharging appears in the SOC-OCV curve of the battery pack 10.

Figure 4:
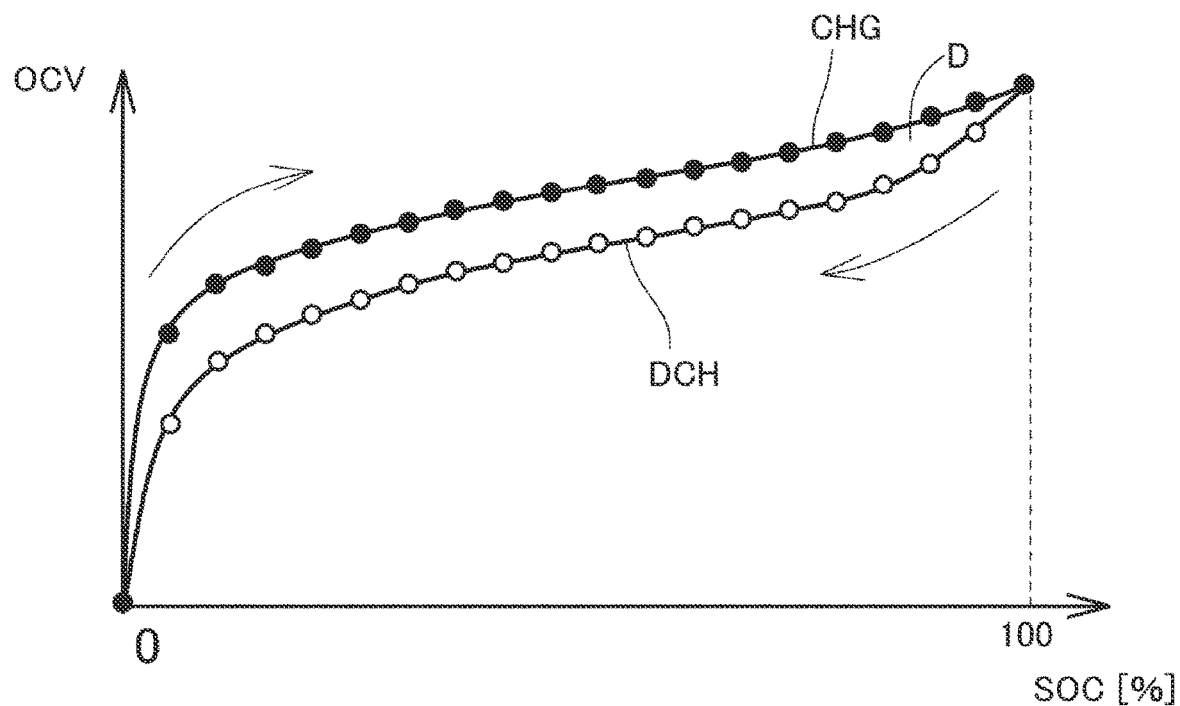
FIG. 4 is a graph that shows an example of hysteresis of an SOC-OCV curve of the battery pack in the first embodiment.

FIG. 4 is a graph that shows an example of the hysteresis of the SOC-OCV curve of the battery pack 10 in the first embodiment. In FIG. 4, and FIG. 5, FIG. 7, FIG. 11, FIG. 13, and FIG. 19 (described later), the abscissa axis represents the SOC of the battery pack 10, and the ordinate axis represents the OCV of the battery pack 10.

FIG. 4 shows a curve CHG and a curve DCH. The curve CHG is acquired by repeating charging and resting (stop of charging) after setting the battery pack 10 to the fully discharged state. The curve DCH is acquired by repeating discharging and resting (stop of discharging) after setting the battery pack 10 to the fully charged state. Hereinafter, an OCV on the curve CHG is referred to as charge OCV, and an OCV on the curve DCH is referred to as discharge OCV. A gap between the charge OCV and the discharge OCV (approximately 150 mV with a silicon-based compound) represents hysteresis.

A charge OCV is acquired as follows. Initially, the battery pack 10 in the fully discharged state is prepared, and is charged with the amount of electric charge (the amount of electricity) corresponding to, for example, 5% of the SOC. Charging is stopped after charging the battery pack 10 with that amount of electric charge, and then the battery pack 10 is left standing for a period of time until polarization caused by charging eliminates (for example, 30 minutes). The OCV of the battery pack 10 is measured after a lapse of the standing time. A combination (SOC, OCV) of the SOC (=5%) after charging and the measured OCV is plotted in the graph.

Subsequently, charging of the battery pack 10 with the amount of electric charge corresponding to the next 5% of the SOC (charging from 5% of the SOC to 10% of the SOC) is started. As the charging completes, the OCV of the battery pack 10 is similarly measured after a lapse of the standing time. From the measured result of the OCV, a combination of the SOC and the OCV is plotted again. After that, a similar procedure is repeated until the battery pack 10 reaches the fully charged state. By performing such measurement, the charge OCV is acquired.

Subsequently, the OCV of the battery pack 10 in decrements of 5% of the SOC is measured while discharging and stop of discharging of the battery pack 10 are repeated this time until the battery pack 10 reaches the fully discharged state from the fully charged state. By performing such measurement, the discharge OCV is acquired. The acquired charge OCV and discharge OCV are stored in the memory 100B of the ECU 100.

The charge OCV represents the maximum value of OCV at each SOC, and the discharge OCV represents the minimum value of OCV at each SOC. For this reason, the status of the battery pack 10 (that is, a combination of SOC and OCV) is plotted on any point on the charge OCV, or the discharge OCV, or within the region D surrounded by the charge OCV and the discharge OCV, in the SOC-OCV characteristic graph. The circumference of the region D corresponds to the circumference of the parallelogram schematically shown in FIG. 3.

Figure 5:
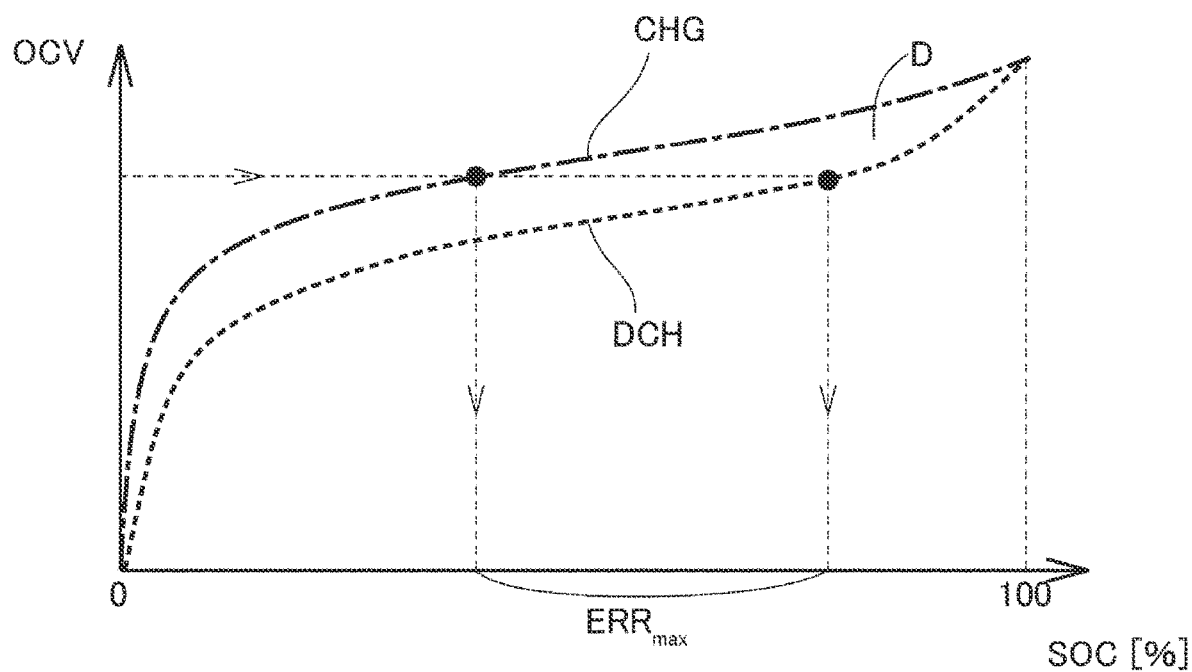
FIG. 5 is a graph for illustrating an SOC estimation error due to hysteresis.

FIG. 5 is a graph for illustrating an SOC estimation error due to hysteresis. For example, in the vehicle 1 that is running, charging and discharging of the battery pack 10 are intermittently repeated in many cases. When the amount of electric charge that is charged into the battery pack 10 is larger than the amount of electric charge that is discharged from the battery pack 10 (when charging is excessive), the OCV of the battery pack 10 tends to be closer to the charge OCV than to the discharge OCV. On the other hand, when the amount of electric charge that is discharged from the battery pack 10 is larger than the amount of electric charge that is charged into the battery pack 10 (when discharging is excessive), the OCV of the battery pack 10 tends to be closer to the discharge OCV than to the charge OCV. However, it is difficult to strictly determine where the status of the battery pack 10 lies within the region D. For this reason, it may be not possible to highly accurately estimate an SOC because of hysteresis. For example, in the example shown in FIG. 5, when an OCV is measured, a maximum error of $ERR_{max}$ can occur between an SOC that is estimated from the OCV by consulting the curve CHG and an SOC that is estimated from the OCV by consulting the curve DCH.

In the present embodiment, a configuration of estimating an SOC in consideration of the influence of hysteresis based on the surface stress σ on an OCV is employed. In this configuration, a surface stress σ is calculated in advance of estimation of an SOC. By performing pre-measurement that will be described below, it is possible to incorporate the influence of the surface stress σ into an estimated result of OCV and correct the OCV.

Pre-Measurement

Figure 6:
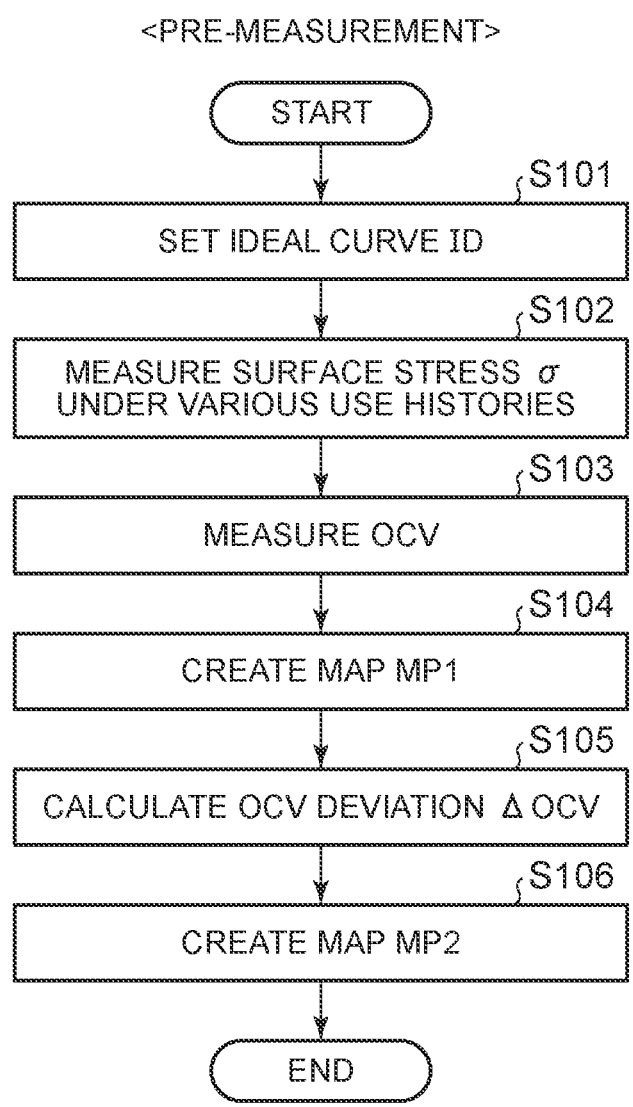
FIG. 6 is a flowchart that shows the procedure of pre-measurement in the first embodiment.

FIG. 6 is a flowchart that shows the procedure of pre-measurement in the first embodiment. The flowchart shown in FIG. 6 is performed by experimenters (developers of the secondary battery system 2).

Referring to FIG. 6, in S101, the experimenters set an SOC-OCV curve that is used as a reference when the SOC estimation process (described later) is executed. In the present embodiment, since a curve in an ideal (virtual) state where no stress is remaining at the surface within the negative electrode active material (a state where σ is nearly equal to zero) is used as a reference, an OCV on the curve (the relation between an SOC and an OCV, represented by the curve) is also referred to as ideal OCV. The ideal OCV corresponds to an example of a first correspondence relation according to the disclosure.

Figure 7:
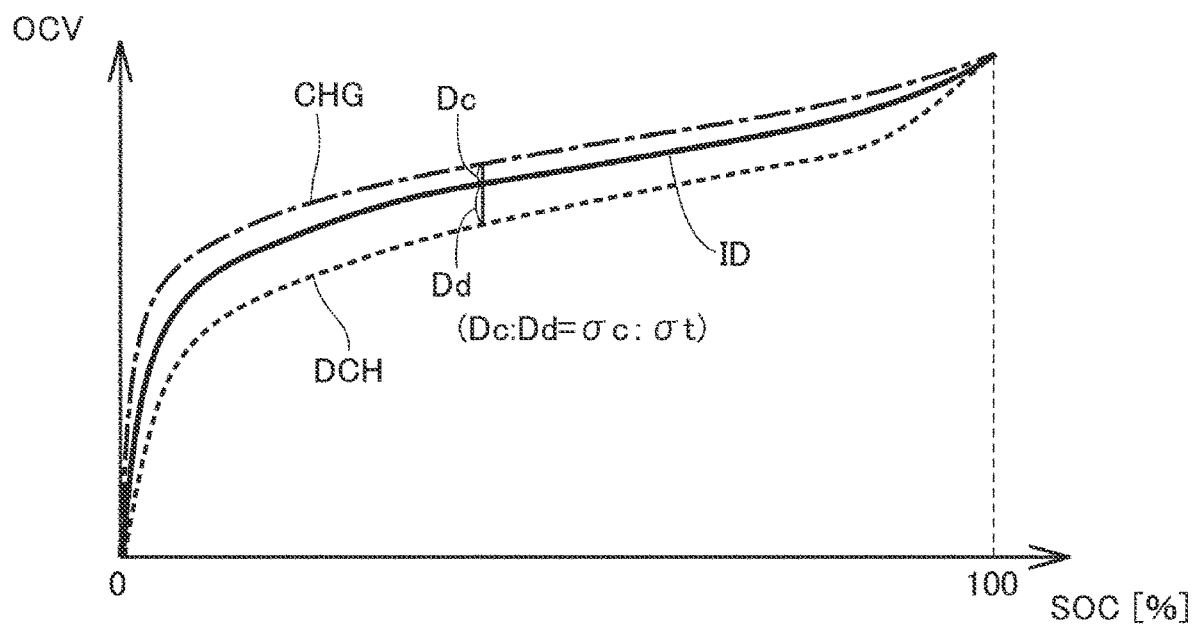
FIG. 7 is a graph for illustrating an example of a technique for setting an ideal OCV.

FIG. 7 is a graph for illustrating an example of a technique for setting an ideal OCV. By consulting FIG. 7, a charge OCV and a discharge OCV are acquired by performing measurement as illustrated in FIG. 4.

As illustrated in FIG. 4, a surface stress σ(a compressive stress σc and a tensile stress σt) in the case where the negative electrode active material plastically deforms is measured (estimated) through film characterization, or the like. An example of a technique for measuring a surface stress σ will be simply described. Initially, a change in the curvature κ of the thin-film negative electrode 117 deformed by a stress is measured. For example, the curvature κ is optically measured with a commercial curvature radius measurement system. By subtracting the measured curvature κ and constants (Young's modulus, Poisson's ratio, thickness, and the like) that are determined in accordance with the material and shape of the negative electrode 117 (the negative electrode active material and its peripheral member) into a Stoney's equation, the surface stress σ is calculated (see, for example, "In Situ Measurements of Stress-Potential Coupling in Lithiated Silicon", V. A. Sethuraman, et al., Journal of The Electrochemical Society, 157 (11) A1253-A1261 (2010) for stress measurement in detail).

The surface stress σ on the charge OCV is substantially constant at the compressive stress σc at yield, and the surface stress σ on the discharge OCV is substantially constant at the tensile stress σt. For this reason, on a curve in which the ratio of a distance Dc between an ideal OCV and a charge OCV and a distance Dd between the ideal OCV and a discharge OCV is equal to the ratio of a compressive stress σc and a tensile stress σt (a curve in which Dc:Dd=σc:σt), the surface stress σ may be regarded as substantially zero. An ideal OCV is set by calculating such a curve.

Referring back to FIG. 6, in S102, the experimenters measure a surface stress σ within the negative electrode active material under various use histories. Specific examples of the use history include the temperature TB of the battery pack 10 within the latest predetermined period (for example, 30 minutes), the current IB input to or output from the battery pack 10, and the SOC of the battery pack 10. The experimenters set the use history of the battery pack 10 to various values, and measure the surface stress σ in each use history.

In S103, the experimenters measure the OCV of the battery pack 10 in each of the use histories of the battery pack 10 (combinations of ($TB_{ave}$, $IB_{ave}$, dSOC, SOC)). The use histories are equivalent to the use histories when the surface stress σ is measured in S102. The process of S102 and the process of S103 are actually executed at the same time. The OCV means a voltage measured in a state where charging and discharging of the battery pack 10 are sufficiently rested (as a result, in a state where the voltage and the concentration of lithium in the active material are relaxed).

In S104, the experimenters create a surface stress map MP1 based on the measured results of the surface stress σ in S102.

Figure 8A:
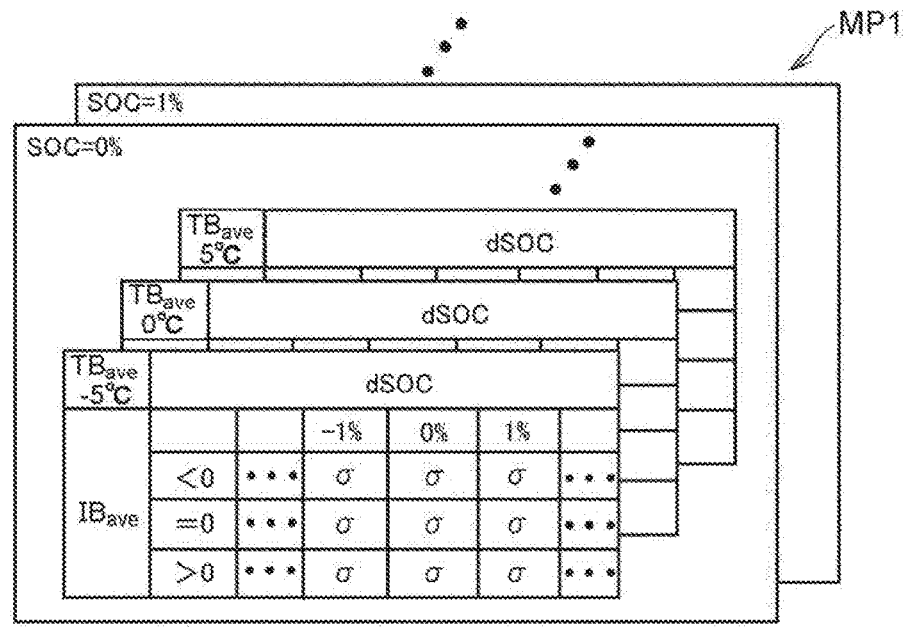
FIG. 8A is a view that shows an example of a surface stress map.
Figure 8B:
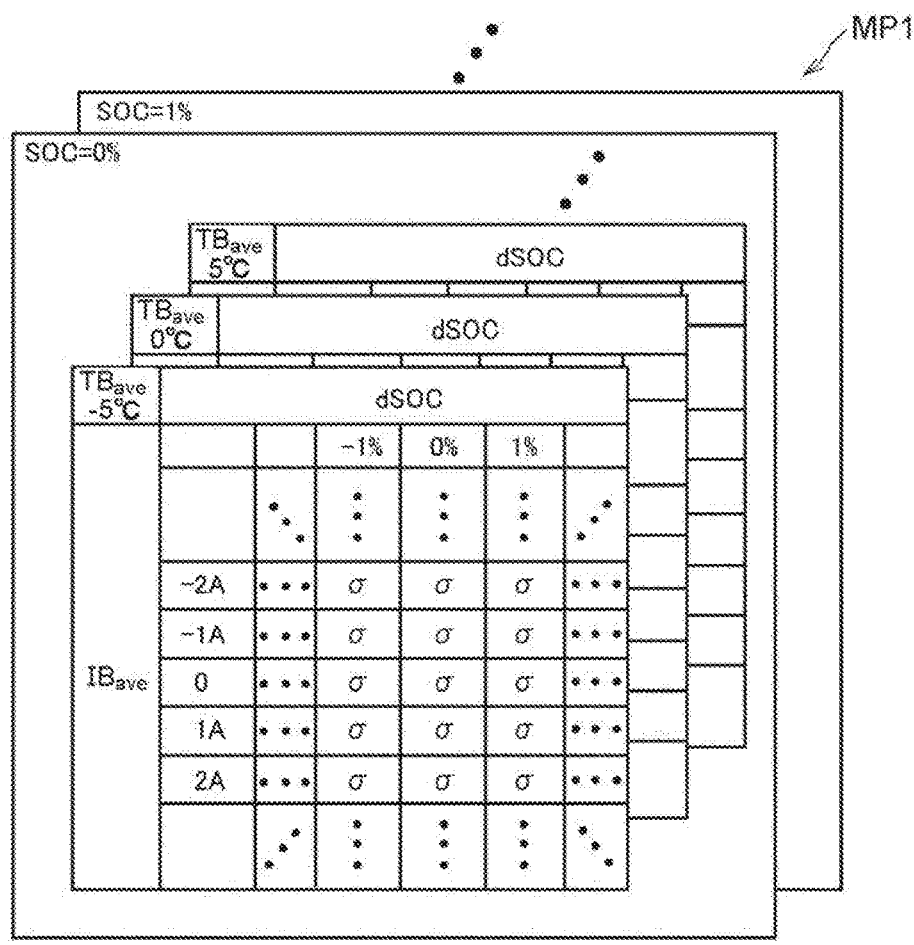
FIG. 8B is a view that shows an example of a surface stress map.

FIG. 8A and FIG. 8B are views that show examples of the surface stress map MP1. Hereinafter, a parameter suffixed with ave denotes a time average within the latest predetermined period. In the surface stress map MP1, for example, a measured result of the surface stress σ that occurs within the negative electrode active material is defined for each combination ($TB_{ave}$, $IB_{ave}$, dSOC, SOC) of the average temperature $TB_{ave}$ of the battery pack 10, the average current IB input to or output from the battery pack 10, the amount of change in SOC dSOC, and the SOC of the battery pack 10.

As shown in FIG. 8A, the average current $IB_{ave}$ may be roughly defined for a positive value (in other words, in the case where the battery pack 10 is in an excessively charged state within the predetermined period), zero, and a negative value (in the case where the battery pack 10 is in an excessively discharged state within the predetermined period). On the other hand, as shown in FIG. 8B, the surface stress map MP1 may be defined for each further subdivided condition of the average current $IB_{ave}$.

The amount of change in SOC dSOC, for example, denotes an amount of change in SOC from the time point at which the sign of the average current $IB_{ave}$ is reversed. However, the amount of change in SOC dSOC is not limited to this configuration. The amount of change in SOC dSOC may be a quantity that indicates a variation in SOC within a set period (which may be a period different from the above-described latest predetermined period or may be the same period).

In the surface stress map MP1 (and a surface stress map MP1A that will be described later with reference to FIG. 12), specific numeric values are assigned to the average temperature $TB_{ave}$, the average current $IB_{ave}$, the amount of change in SOC dSOC, the SOC, and the like. However, these numeric values are only illustrative for the sake of easy understanding of the surface stress map MP1, and do not limit the content of the surface stress map MP1.

In S105, the experimenters calculate an OCV deviation ΔOCV that represents the influence of the surface stress σ on the OCV. In the present embodiment, the OCV deviation ΔOCV is a potential difference between an OCV on an ideal ID (hereinafter, also referred to as $OCV_{ID}$) and an OCV that is estimated from the voltage VB, current IB, and the like, of the battery pack 10 (hereinafter, also referred to as $OCV_{ES}$), and is expressed by the following mathematical expression (1). The OCV deviation ΔOCV may also be regarded as an amount of change in OCV due to a surface stress σ with reference to an OCV in the case where the surface stress σ is the reference stress (=0).

$$OCV_{ID} - OCV_{ES} = \Delta OCV \qquad (1)$$

The experimenters create an OCV deviation map MP2 that shows the correspondence relation between a surface stress σ and an OCV deviation ΔOCV (S106).

Figure 9:
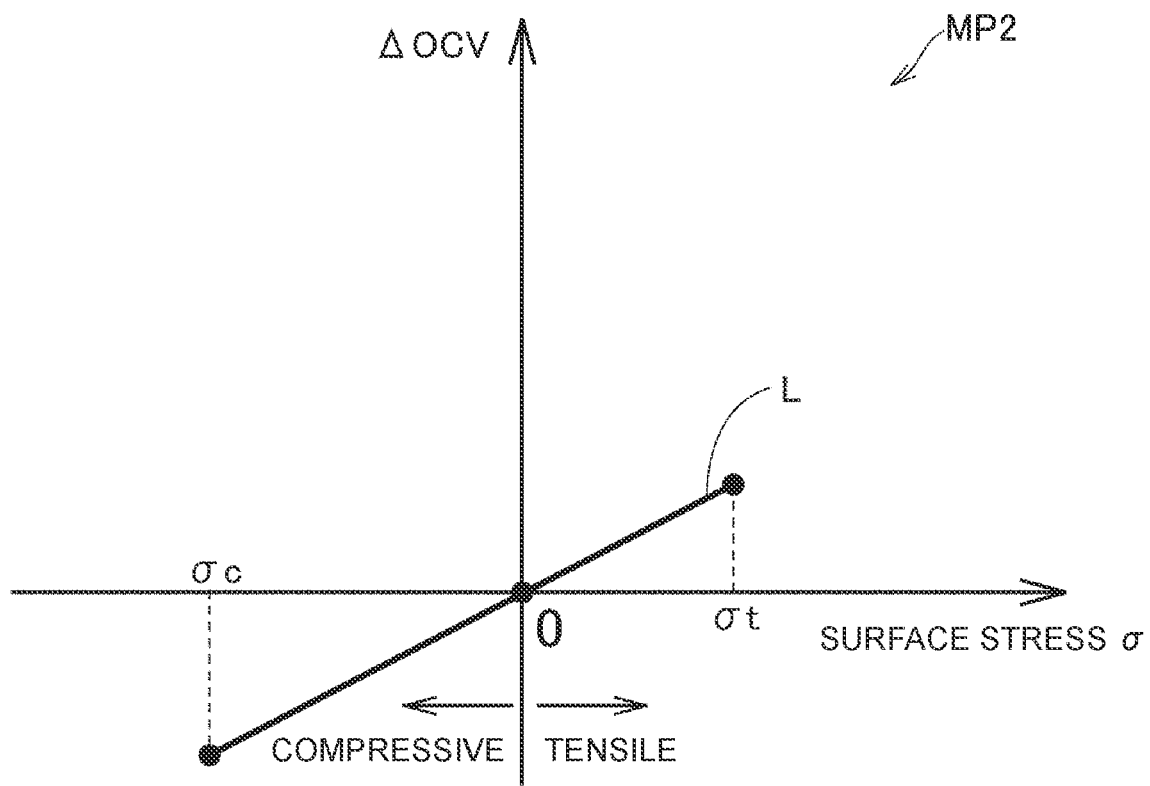
FIG. 9 is a graph for illustrating a technique for creating an OCV deviation map.

FIG. 9 is a graph for illustrating a technique for creating the OCV deviation map MP2. In FIG. 9, the abscissa axis represents a surface stress 6, and the ordinate axis represents an OCV deviation ΔV.

As shown in FIG. 9, from the definition of the OCV deviation ΔOCV in the present embodiment, when the surface stress σ is zero, the OCV deviation ΔOCV is also zero. By setting a reference in this way, the OCV deviation map MP2 that shows the correspondence relation between a surface stress σ and an OCV deviation ΔOCV is created. By consulting the OCV deviation map MP2, it is possible to calculate an OCV deviation ΔOCV from a surface stress σ. The OCV deviation map MP2 corresponds to an example of a second correspondence relation according to the disclosure.

In the case where the battery pack 10 is in an excessively charged state (in the case where a compressive stress occurs at the negative electrode active material surface), the negative electrode active material expands as a result of insertion of lithium, with the result that a negative electrode open circuit potential decreases. Therefore, an $OCV_{ES}$ is higher than an $OCV_{ID}$ on the ideal OCV (curve ID). Thus, an OCV deviation ΔOCV is negative (see the mathematical expression (1)). On the other hand, in the case where the battery pack 10 is in an excessively discharged state (in the case where a tensile stress occurs), an OCV deviation ΔOCV is positive.

Using the OCV deviation map MP2 to calculate an OCV deviation ΔOCV is not indispensable. The following mathematical expression (2) holds between a surface stress σ and an OCV deviation ΔOCV. In the mathematical expression (2), the amount of increase in the volume of the negative electrode active material in the case where 1 mol of lithium is inserted is denoted by Ω (m$^3$/mol), and Faraday constant is denoted by F (C/mol). k is a proportionality constant obtained experimentally. An OCV deviation ΔOCV may be calculated from a surface stress σ with the use of the mathematical expression (2) instead of the OCV deviation map MP2.

$$\Delta OCV = k \times \Omega \times \sigma / F \qquad (2)$$

SOC Estimation Flow

Figure 10:
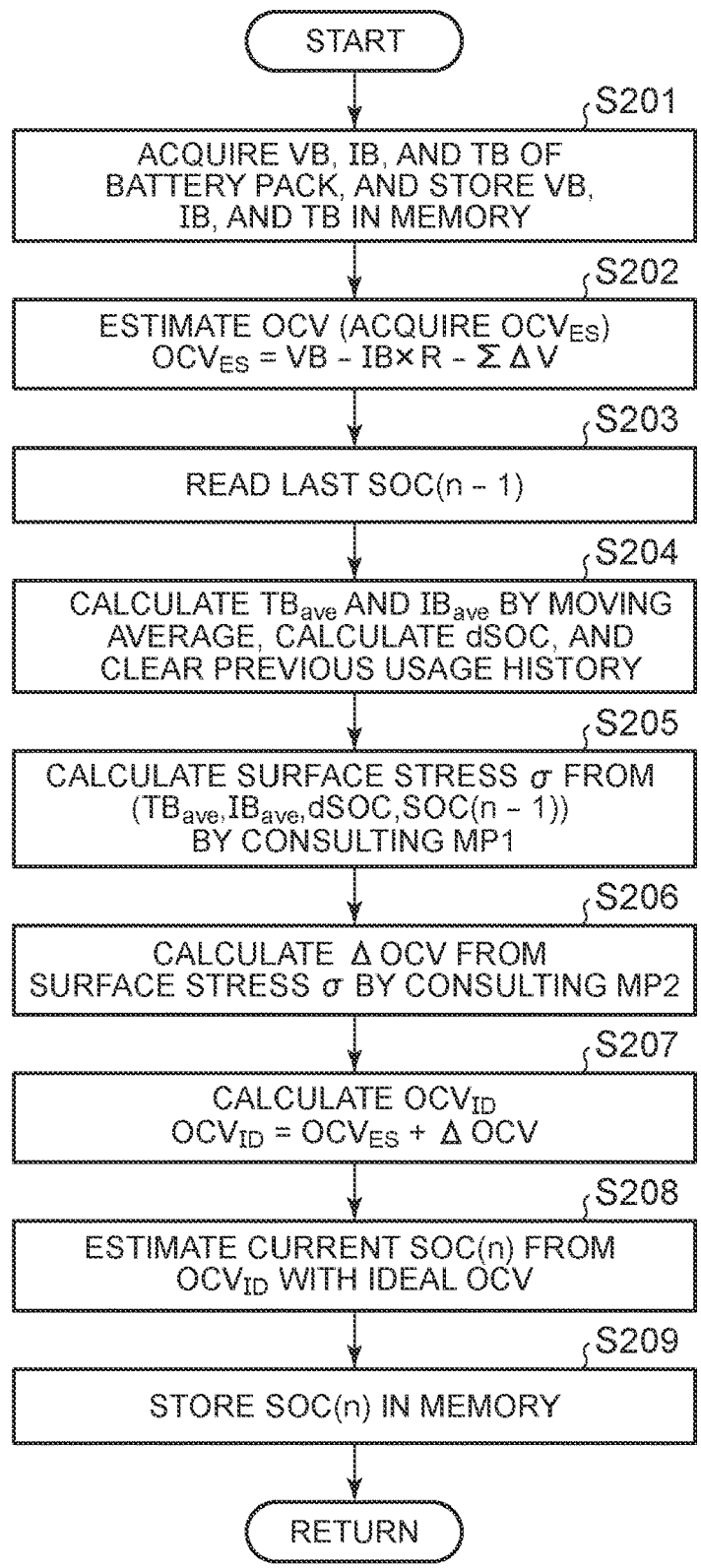
FIG. 10 is a flowchart for illustrating an SOC estimation process in the first embodiment.

FIG. 10 is a flowchart for illustrating the SOC estimation process in the first embodiment. The flowcharts shown in FIG. 10, and FIG. 14, FIG. 20, and FIG. 21 (described later) are, for example, called from a main routine (not shown) each time a predetermined computation cycle elapses, and are repeatedly executed by the ECU 100. A current computation cycle is the nth (n is larger than or equal to two) computation cycle, and n is suffixed to a parameter of the current computation cycle, (n−1) is suffixed to a parameter of the last computation cycle, and the current computation cycle and the last computation cycle are distinguished from each other.

Steps (hereinafter, abbreviated as "S") included in the flowcharts shown in FIG. 10, and FIG. 14 to FIG. 18, FIG. 20, and FIG. 21 are basically implemented by software processing of the ECU 100. Instead, the steps may be implemented by an exclusive hardware (electric circuit) prepared in the ECU 100.

In S201, the ECU 100 acquires the voltage VB, current IB and temperature TB of the battery pack 10 from the sensors (the voltage sensor 21, the current sensor 22, and the temperature sensor 23) in the monitoring unit 20. The acquired parameters are stored in the memory 100B.

In S202, the ECU 100 estimates the OCV of the battery pack 10 (acquires an $OCV_{ES}$). The $OCV_{ES}$ is calculated in accordance with the following mathematical expression (3). In the mathematical expression (3), the internal resistance of the battery pack 10 is denoted by R. A correction term for correcting the influence of polarization that has occurred in the battery pack 10 is denoted by $\Sigma \Delta V_i$ (i is natural number). With this correction term $\Sigma \Delta V_i$, polarization that occurs from diffusion of lithium within the positive electrode active material and within the negative electrode active material and diffusion of lithium salt within the electrolyte is corrected. When diffusion of lithium within the negative electrode active material is considered, it is desirable to consider the influence of both a lithium concentration difference and an internal stress within the negative electrode active material. It is assumed that the correction term $\Sigma \Delta V_i$ is obtained by preliminary experiment in advance and is stored in the memory 100B. The correction term $\Sigma \Delta V_i$ is also determined such that the value is positive during charging of the battery pack 10.

$$OCV_{ES} = VB - IB \times R - \Sigma \Delta V_i \qquad (3)$$

In S203, the ECU 100 reads an SOC(n−1) calculated in the last computation cycle from the memory 100B.

In S204, the ECU 100 calculates a time average of each of the current IB and temperature TB of the battery pack 10 within the latest predetermined period (for example, 30 minutes). At this time, the ECU 100 desirably writes over a use history before the predetermined period or erases the use history before the predetermined period from the memory 100B. In other words, for example, it is possible to calculate an average current $IB_{ave}$ and an average temperature $TB_{ave}$ in accordance with the concept of moving average. The ECU 100, for example, calculates an amount of change in SOC dSOC. The amount of change in SOC dSOC is an amount of change in SOC from the time point at which the sign of the average current $IB_{ave}$ is reversed.

In S205, the ECU 100 calculates a surface stress σ within the negative electrode active material based on the use history ($TB_{ave}$, $IB_{ave}$, dSOC, SOC(n−1)) of the battery pack 10 by consulting the surface stress map MP1 shown in FIG. 8A or FIG. 8B.

In S206, the ECU 100 calculates an OCV deviation ΔOCV from the surface stress σ calculated in S205 by consulting the OCV deviation map MP2 shown in FIG. 9.

In S207, the ECU 100 calculates an $OCV_{ID}$ that is an ideal OCV obtained by correcting a deviation of OCV due to the influence of the surface stress σ. The $OCV_{ID}$ is calculated with the use of the $OCV_{ES}$ and the OCV deviation ΔOCV calculated by consulting the OCV deviation map MP2 in S206 (see the mathematical expression (1)).

In S208, the ECU 100 estimates an SOC corresponding to the ideal $OCV_{ID}$ calculated in S207 as an SOC(n) of the current computation cycle with the use of the ideal OCV. The estimated SOC(n) is stored in the memory 100B in order to be used in the process of S203 in the next computation cycle (S209).

As described above, according to the first embodiment, the hysteresis of OCV due to the surface stress σ is considered. In more detail, the $OCV_{ES}$ deviates from the ideal OCV on the influence of the surface stress σ. For this reason, an ideal $OCV_{ID}$ is calculated by correcting the $OCV_{ES}$ (removing the influence of the surface stress σ) with the OCV deviation ΔOCV that represents a deviation of OCV due to the surface stress σ. According to the ideal OCV, an SOC corresponding to the ideal $OCV_{ID}$ is estimated as the SOC of the battery pack 10. Thus, even when the amount of volume change resulting from charging or discharging is large and an active material (silicon-based compound) in which the influence of hysteresis remarkably appears is employed for the negative electrode 117, it is possible to highly accurately estimate an SOC.

In the above description, the previous use history before the predetermined period is discarded (written over or erased) in advance of consulting the surface stress map MP1. Generally, an onboard ECU has restrictions on throughput (the computation performance of the CPU and the capacity of the memory) as compared to a stationary computing unit (such as a simulation terminal). For this reason, a reduction in the amount of use history that is used to calculate a surface stress σ is needed for a vehicle. According to the present embodiment, by setting the length of the predetermined period to an appropriate value based on preliminary evaluation experiment, the amount of use history that is used to calculate a surface stress σ is reduced while ensuring the accuracy of calculating a surface stress σ. Thus, even when the computation performance of the CPU 100A is relatively low or the capacity of the memory 100B is relatively small, it is possible to execute the SOC estimation process.

Alternative Embodiment to First Embodiment

In the first embodiment, the example in which an ideal OCV in an ideal state where no surface stress σ is remaining inside the negative electrode active material is used as a reference is described. However, the ideal OCV is just an example of the SOC-OCV curve that is used as a reference in the SOC estimation process, and the SOC-OCV curve that is used as a reference in the SOC estimation process is not limited to the ideal OCV. In an alternative embodiment to the first embodiment, an example in which another OCV (referred to as reference OCV and is indicated by REF) is used instead of the ideal OCV is described.

Figure 11:
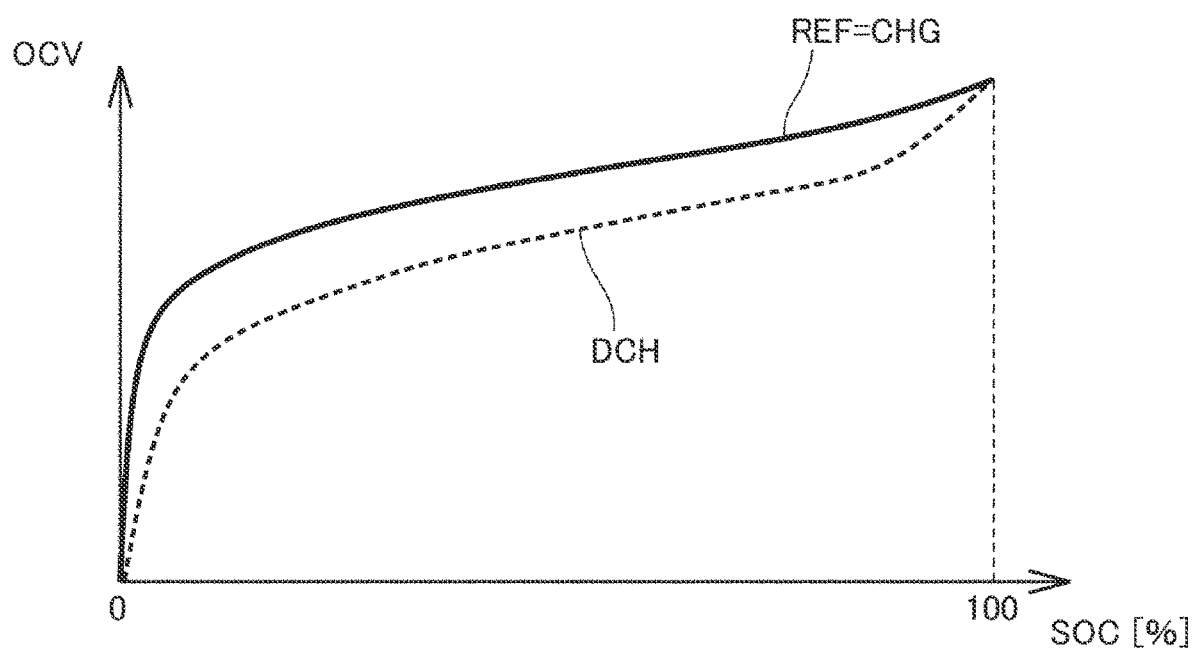
FIG. 11 is a graph for illustrating a reference OCV.

FIG. 11 is a graph for illustrating an example of the reference OCV. As shown in FIG. 11, for example, the reference OCV may be set so as to coincide with the charge OCV. In this case, an OCV deviation ΔOCV is read as a deviation of OCV from the reference OCV. In this way, the reference OCV may be set so as to coincide with the charge OCV. Although not described again, it is also possible to set the reference OCV such that the reference OCV coincides with the discharge OCV.

Furthermore, it is not indispensable that the reference OCV coincides with the charge OCV or the discharge OCV. The reference OCV just needs to be the one that shows the correspondence relation between an OCV and an SOC at the time when the surface stress σ is substantially constant at a reference stress. The OCV deviation map MP2 may be created as needed in accordance with the thus set reference OCV. Specifically, the reference OCV may be set on the assumption that an intermediate OCV between the charge OCV and the discharge OCV is a virtual ideal state. In this case, the reference OCV is set on the assumption that the compressive stress σc and tensile stress σt at the negative electrode active material surface are equal to each other. In this case, the compressive stress σc (=tensile stress σt) at the yield may vary for each SOC.

Second Embodiment

In the first embodiment, the surface stress map MP1 (see FIG. 8A) includes the SOC and average current $IB_{ave}$ of the battery pack 10 as parameters. The SOC is a parameter for calculating the influence of a lithium content inside the negative electrode active material on the surface stress G. In addition, in the surface stress map MP1, by using not only the SOC but also the average current $IB_{ave}$, the influence of a mode of insertion and desorption of lithium (for example, a lithium insertion rate and a lithium desorption rate) on the surface stress σ is calculated.

The present inventors found that the accuracy of calculating a surface stress σ improves when the amount of electric charge that has been charged or discharged from the time point at which the battery pack 10 has been switched from one of a charging state and a discharging state to the other (in more detail, at the time point at which the OCV of the battery pack 10 deviates from one of the charge OCV and the discharge OCV). For this reason, in the second embodiment, a configuration in which a surface stress map MP1A different from the surface stress map MP1 is used will be described. The overall configuration of a secondary battery system according to the second embodiment is basically equivalent to the configuration of the secondary battery system 2 (see FIG. 1) according to the first embodiment (this also applies to third and fourth embodiments (described later)).

Surface Stress Map

Figure 12:
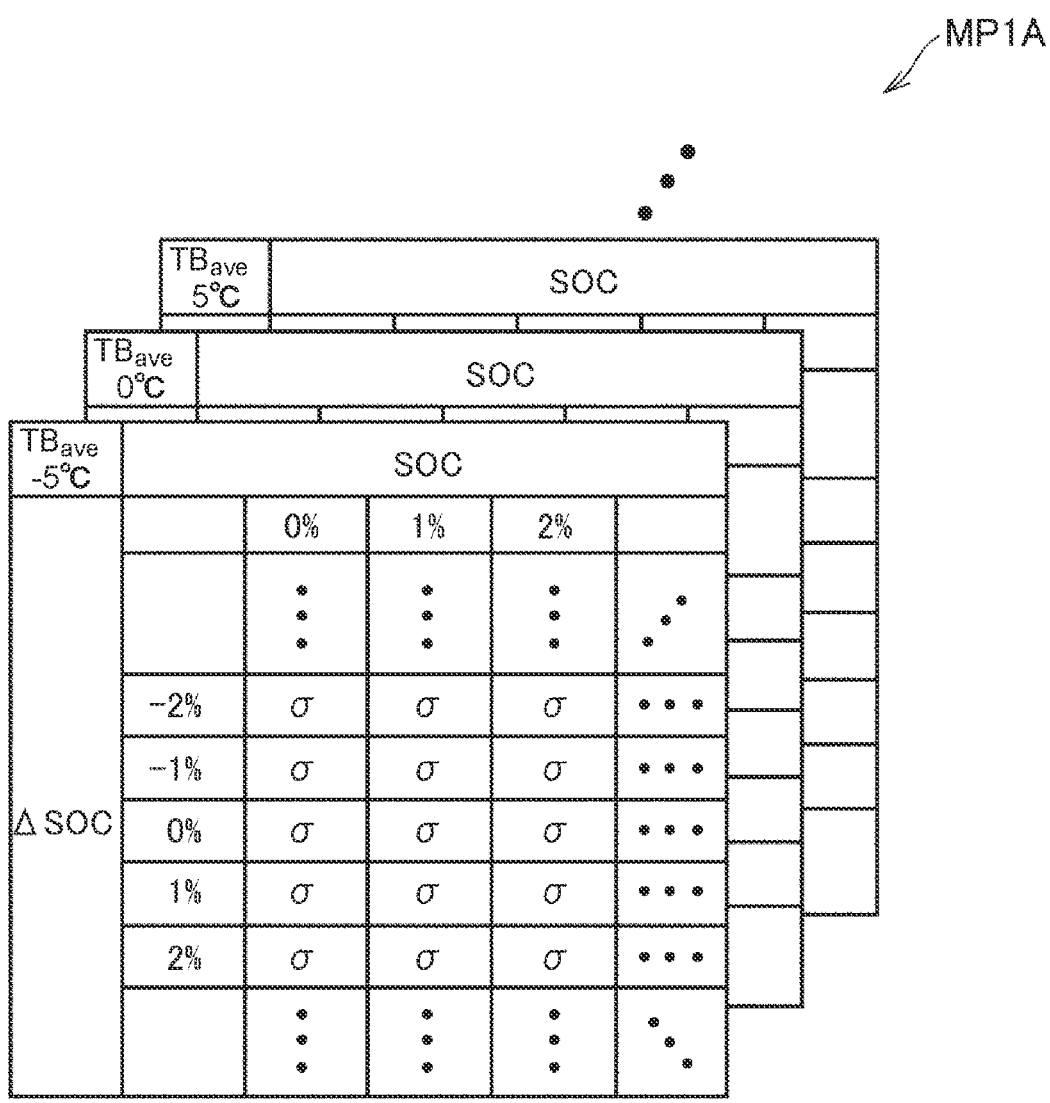
FIG. 12 is a view that shows an example of a surface stress map in a second embodiment.

FIG. 12 is a view that shows an example of the surface stress map MP1A in the second embodiment. In the surface stress map MP1A, for example, a measured result of the surface stress σ is defined for each combination ($TB_{ave}$, ΔSOC, SOC) of the average temperature $TB_{ave}$ of the battery pack 10, the amount of change in SOC ΔSOC, and the SOC of the battery pack 10.

The amount of change in SOC ΔSOC is an amount of change in SOC from a reference SOC (hereinafter, also referred to as reference $SOC_{REF}$), and is a parameter that differs from the amount of change in SOC dSOC described in FIG. 8A and FIG. 8B. A full charge capacity C of the battery pack 10 is known. Therefore, the amount of change in SOC ΔSOC is calculated by integrating a current from the reference $SOC_{REF}$ and dividing the amount of electric charge (ΔAh) obtained through integration by the full charge capacity C (ΔSOC=ΔAh/C). An SOC may be obtained by assigning predetermined weights to the SOC estimated through current integration and the SOC highly accurately estimated in accordance with the disclosure (the SOC estimated by consulting the SOC-OCV curve) and adding up (so to speak, blending) these SOCs, and the amount of change in the obtained SOC from the reference $SOC_{REF}$ may be calculated. The surface stress map MP1A may further include the average current $IB_{ave}$ as the fourth parameter in addition to the three parameters shown in FIG. 12.

Flag Control

In order to calculate an amount of change in SOC ΔSOC, it is required to determine the reference $SOC_{REF}$ from which current integration is started. Therefore, in the second embodiment, the ECU 100 controls a flag F for determining the start point of current integration. The flag F takes any one of 1 to 3, and is stored in the memory 100B of the ECU 100 in a nonvolatile manner.

Figure 13:
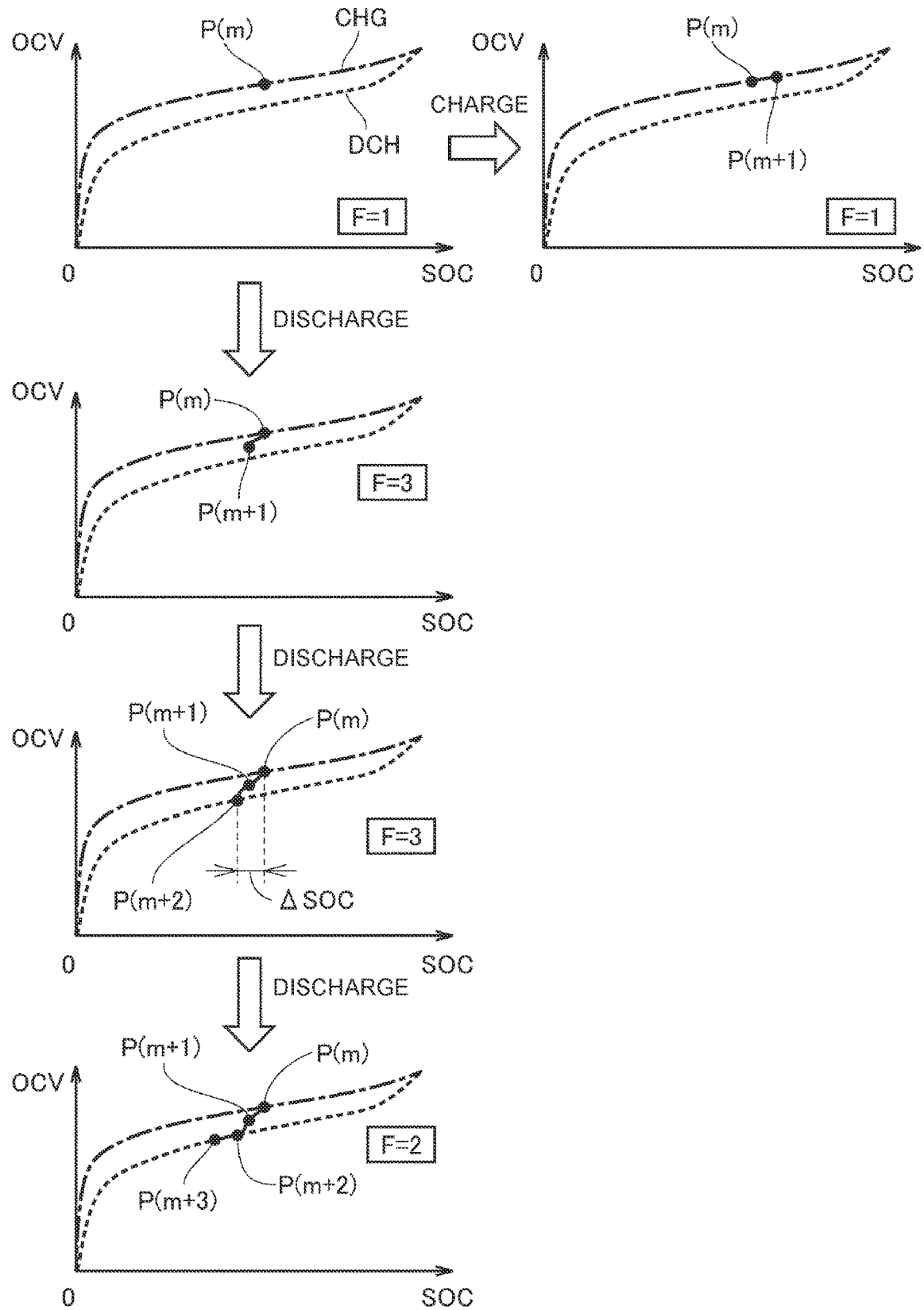
FIG. 13 is a view for illustrating a technique for controlling a flag in the second embodiment.

FIG. 13 is a view for illustrating a technique for controlling the flag F in the second embodiment. The status of the battery pack 10 (a combination of OCV and SOC), determined through the SOC estimation process of the mth (m is natural number) computation cycle, is denoted by P(m). FIG. 13 shows an example in which the battery pack 10 is charged and the state P(m) of the battery pack 10 is plotted on the charge OCV.

When charging of the battery pack 10 has been continued from the state P(m), a state P(m+1) in the (m+1)th computation cycle is plotted on the charge OCV as shown in FIG. 13. In this way, when the battery pack 10 has been further charged from the state P on the charge OCV, the flag F is set to 1. Thus, a first estimation process (see FIG. 15, described later) is executed.

On the other hand, when the battery pack 10 has been discharged from the state P(m) shown in FIG. 13, the state P(m+1) in the (m+1)th computation cycle deviates from the charge OCV and is plotted between the charge OCV and the discharge OCV as shown in FIG. 13. In this way, when the battery pack 10 has been discharged from the state P plotted on the charge OCV, the flag F is set to 3. Thus, a third estimation process (see FIG. 17) is executed.

After that, as discharging of the battery pack 10 is continued, a state P(m+2) reaches the discharge OCV in, for example, the (m+2)th computation cycle (see FIG. 13). When the battery pack 10 has been further discharged from the state P on the discharge OCV, the flag F is set to 2. Thus, a second estimation process (see FIG. 16) is executed.

In the case of F=1, after the first estimation process is executed, the reference $SOC_{REF}$ is updated to a new SOC (the SOC estimated through the first estimation process). Together with the update of the reference $SOC_{REF}$, current integration for calculating an amount of change in SOC ΔSOC is reset. In the case of F=2, as well as the case of F=1, the reference $SOC_{REF}$ is updated to an SOC estimated through the second estimation process, and current integration is reset.

In contrast, in the case of F=3, the reference $SOC_{REF}$ is not updated, and is kept at a value before the third estimation process is executed. Furthermore, current integration for calculating an amount of change in SOC ΔSOC is also continued. Updating or not updating the reference $SOC_{REF}$ will be described in detail with reference to the processing flow of an update process shown in FIG. 18.

SOC Estimation Flow

Figure 14:
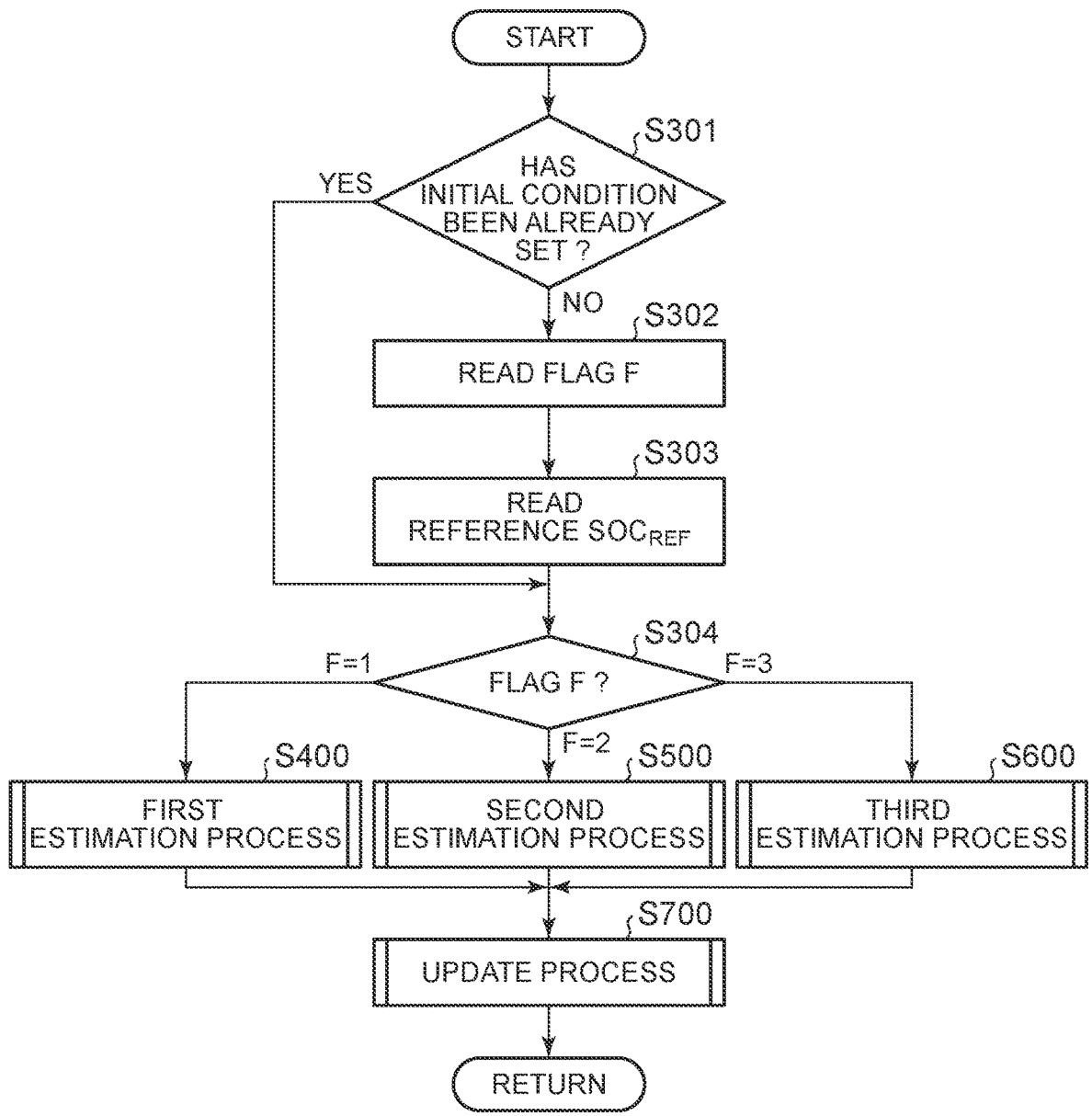
FIG. 14 is a flowchart for illustrating the overall flow of an SOC estimation process in the second embodiment.

FIG. 14 is a flowchart for illustrating the overall flow of an SOC estimation process in the second embodiment. The memory 100B of the ECU 100 stores the reference $SOC_{REF}$ together with the flag F obtained in the last computation cycle.

Referring to FIG. 1 and FIG. 14, in S301, the ECU 100 determines whether an initial condition for estimating the SOC of the battery pack 10 has been already set. For example, just after the ignition of the vehicle 1 is turned on (IG-ON), no initial condition is set (NO in S301). Therefore, the ECU 100 advances the process to S302, and reads the flag F stored in the memory 100B. In addition, the ECU 100 reads the reference $SOC_{REF}$ from the memory 100B (S303). After that, the process is advanced to S304. During execution of the series of processes shown in FIG. 14 for the second and subsequent times, the initial condition has been already set (YES in S301), and the processes of S302 and S303 are skipped.

In S304, the ECU 100 determines the value of the flag F. As described above, when the flag F is 1, the ECU 100 executes the first estimation process (S400). When the flag F is 2, the ECU 100 executes the second estimation process (S500). When the flag F is 3, the ECU 100 executes the third estimation process (S600). As any one of the first to third estimation processes ends, the flag F that will be used in the next SOC estimation process is updated, and the update process for updating the reference $SOC_{REF}$ is further executed (S700). After that, the process is returned to the main routine.

Figure 15:
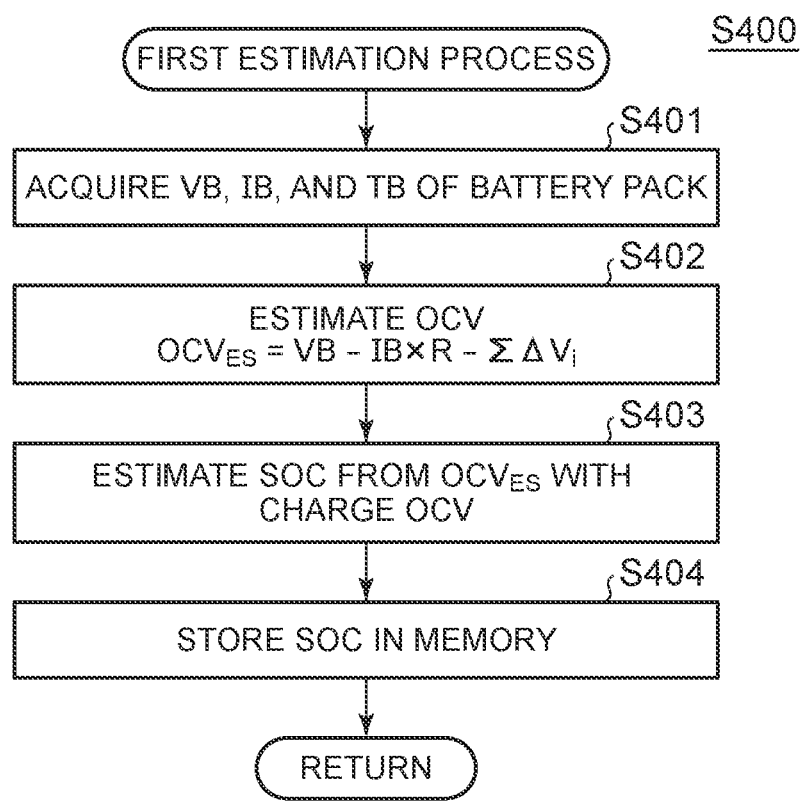
FIG. 15 is a flowchart that shows a first estimation process.

FIG. 15 is a flowchart that shows the first estimation process. Referring to FIG. 1 and FIG. 15, in S401, the ECU 100 acquires the voltage VB, current IB and temperature TB of the battery pack 10 from the sensors in the monitoring unit 20. In addition, in S402, the ECU 100 estimates the OCV ($OCV_{ES}$) of the battery pack 10. The processes of S401 and S402 are respectively equivalent to the processes of S201 and S202 in the first embodiment.

In S403, the ECU 100 estimates an SOC from the $OCV_{ES}$ with the use of the charge OCV. The estimated SOC is stored in the memory 100B (S404).

Figure 16:
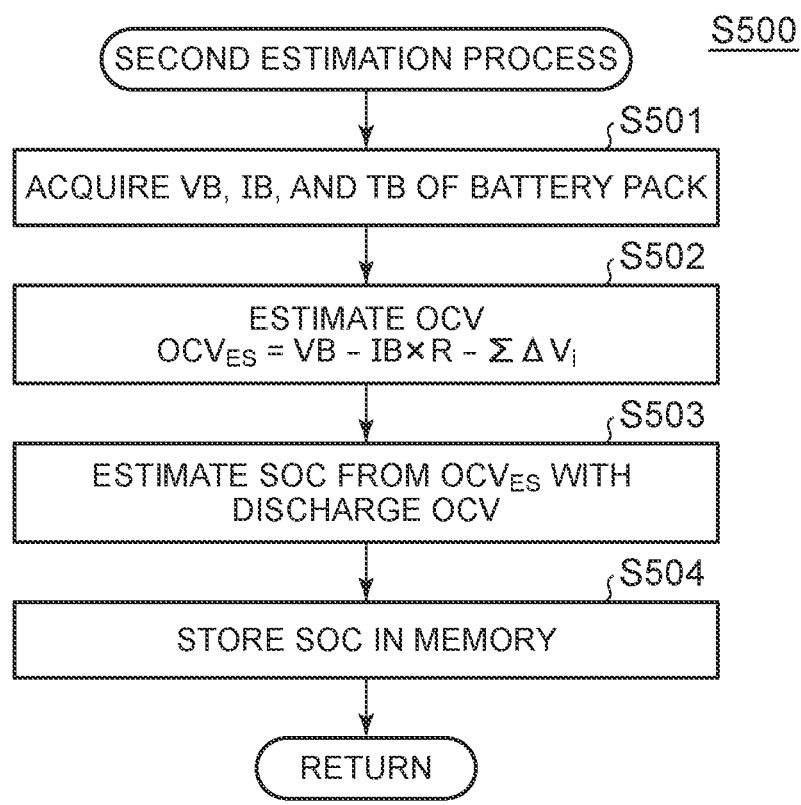
FIG. 16 is a flowchart that shows a second estimation process.

FIG. 16 is a flowchart that shows the second estimation process. Referring to FIG. 16, the second estimation process is basically equivalent to the first estimation process except that the discharge OCV is used instead of the charge OCV in the process of S503, so the detailed description is not repeated.

Figure 17:
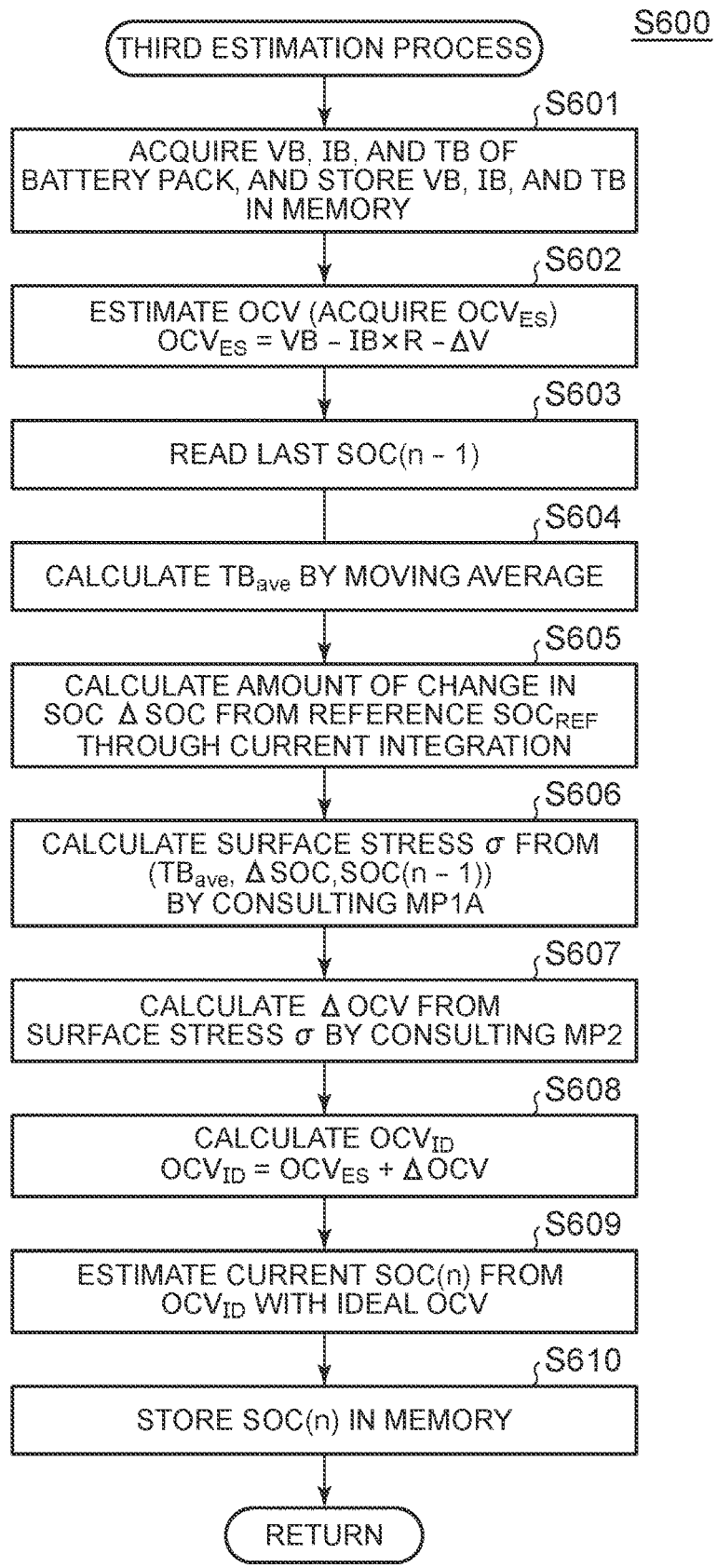
FIG. 17 is a flowchart that shows a third estimation process.

FIG. 17 is a flowchart that shows the third estimation process. In the second embodiment, the third estimation process corresponds to an example of an SOC estimation process according to the disclosure. Referring to FIG. 1 and FIG. 17, the processes of S601 to S603 are respectively equivalent to the processes of S201 to S203 (see FIG. 10) in the first embodiment.

In S604, the ECU 100 calculates a time average of the temperature TB of the battery pack 10 within a predetermined period (for example, 30 minutes) in accordance with the concept of moving average. A temperature history before the predetermined period is written over or erased from the memory 100B.

In S605, the ECU 100 calculates an amount of change in SOC ΔSOC. As described above, the amount of change in SOC is calculated by dividing the amount of electric charge obtained through current integration by the full charge capacity C.

In S606, the ECU 100 calculates a surface stress σ inside the negative electrode active material based on the use history ($TB_{ave}$, ΔSOC, SOC(n−1)) of the battery pack 10 by consulting the surface stress map MP1A shown in FIG. 12.

In S607, the ECU 100 calculates an OCV deviation ΔOCV from the surface stress σ by consulting the OCV deviation map MP2 shown in FIG. 9. The subsequent processes of S608 to S610 are respectively equivalent to the processes of S207 to S209 (see FIG. 10) in the first embodiment.

Figure 18:
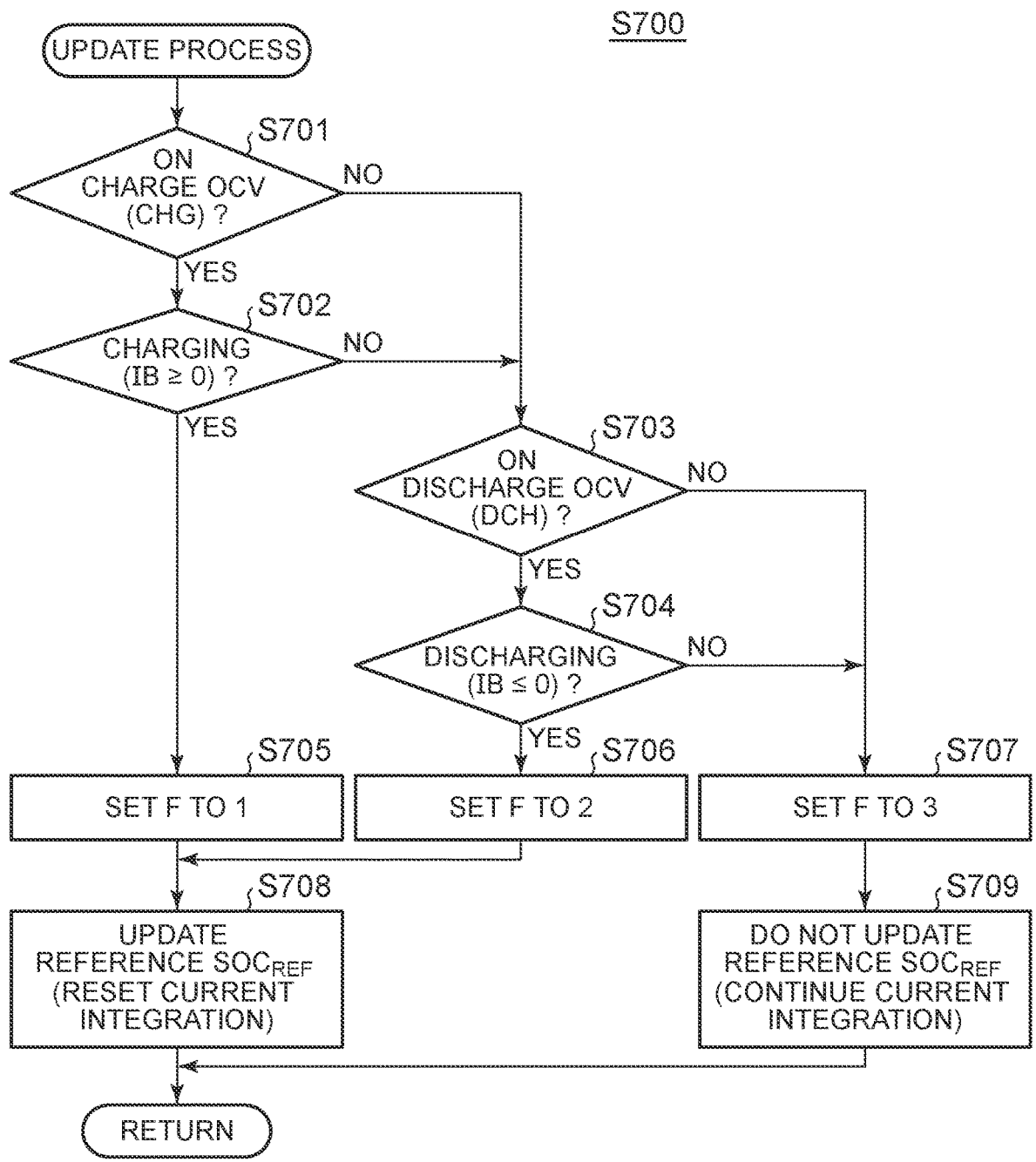
FIG. 18 is a flowchart that shows an update process.

FIG. 18 is a flowchart that shows the update process. Referring to FIG. 1, FIG. 13, and FIG. 18, in S701, the ECU 100 determines whether the state P (a combination of OCV and SOC) of the battery pack 10, obtained by any one of the first to third estimation processes, lies on the charge OCV. When the state P lies on the charge OCV (YES in S701), the ECU 100 further determines whether the battery pack 10 is being charged (S702). When the current IB is positive, it is determined that the battery pack 10 is being charged. Unless the battery pack 10 is discharged, the state P is kept on the charge OCV, and it is not required to change the technique for estimating an SOC, so it may be determined that the battery pack 10 is being charged also in the case where the current IB is zero.

When the battery pack 10 is being charged (YES in S702), the ECU 100 advances the process to S705, and sets the flag F to 1 (see FIG. 13). On the other hand, when the state P does not lie on the charge OCV (NO in S701) or when the state P lies on the charge OCV but the battery pack 10 has been discharged (NO in S702, see FIG. 13), the ECU 100 advances the process to S703.

In S703, the ECU 100 determines whether the state P of the battery pack 10 lies on the discharge OCV. When the state P lies on the discharge OCV (YES in S703), the ECU 100 further determines whether the battery pack 10 is being discharged (S704).

When the battery pack 10 is being discharged (YES in S704), the ECU 100 advances the process to S706, and sets the flag F to 2 (see FIG. 13). When the flag F has been set to 1 (when the process of S705 has been executed), the ECU 100 updates the reference $SOC_{REF}$ to a new SOC estimated through the first estimation process, and resets current integration (S708). When the flag F has been set to 2 (when the process of S706 has been executed), in the same manner, the reference $SOC_{REF}$ is updated and current integration is reset.

In contrast, when the state P of the battery pack 10 does not lie on the discharge OCV in S703 (NO in S703), the state P neither lies on the charge OCV nor lies on the discharge OCV. When the state P of the battery pack 10 lies on the discharge OCV but the battery pack 10 has been charged thereafter (NO in S704), the state P deviates from the discharge OCV. In this way, when the state P neither lies on the charge OCV nor lies on the discharge OCV, the ECU 100 advances the process to S707, and sets the flag F to 3. In addition, the ECU 100 does not update the reference $SOC_{REF}$, and holds the value before execution of the third estimation process (the value estimated through the first or second estimation process). The ECU 100 also continues current integration for calculating an amount of change in SOC ΔSOC (S709).

As described above, according to the second embodiment, as in the case of the first embodiment, by considering the hysteresis of OCV due to a surface stress σ, it is possible to highly accurately estimate an SOC even when an active material of which the amount of volume change resulting from charging or discharging is large is used for the negative electrode 117. In addition, in the second embodiment, a surface stress σ is calculated based on an amount of change in SOC ΔSOC from the time point at which the OCV of the battery pack 10 deviates from the charge OCV or the discharge OCV (the time point at which the state of the battery pack 10 deviates from the charge curve CHG or the discharge curve DCH) with the use of the surface stress map MP1A. Thus, it is possible to improve the accuracy of calculating a surface stress σ, and, by extension, it is possible to further improve the accuracy of estimating an SOC.

In the second embodiment, the example in which an SOC is estimated separately among the first to third estimation processes and the surface stress map MP1A is used in only the third estimation process is described. Alternatively, a surface stress map MP1A that is used on the charge OCV and a surface stress map MP1A that is used on the discharge OCV may be further prepared, and an SOC may be estimated on the charge OCV or on the discharge OCV as well with the use of the map as in the case of the region D between those curves (during execution of the third estimation process). In such a case as well, the flag F is controlled in order to update the reference $SOC_{REF}$ and reset current integration.

Third Embodiment

For example, a configuration in which a composite material made of a complex containing a silicon-based compound and graphite is employed as the negative electrode active material is also conceivable. An SOC-OCV curve in the case where such a composite material is employed exhibits hysteresis characteristics different from hysteresis characteristics in the case where a silicon-based compound is employed solely. In the third embodiment, an SOC estimation process for making use of the feature of the hysteresis characteristics of the composite material will be described.

Figure 19:
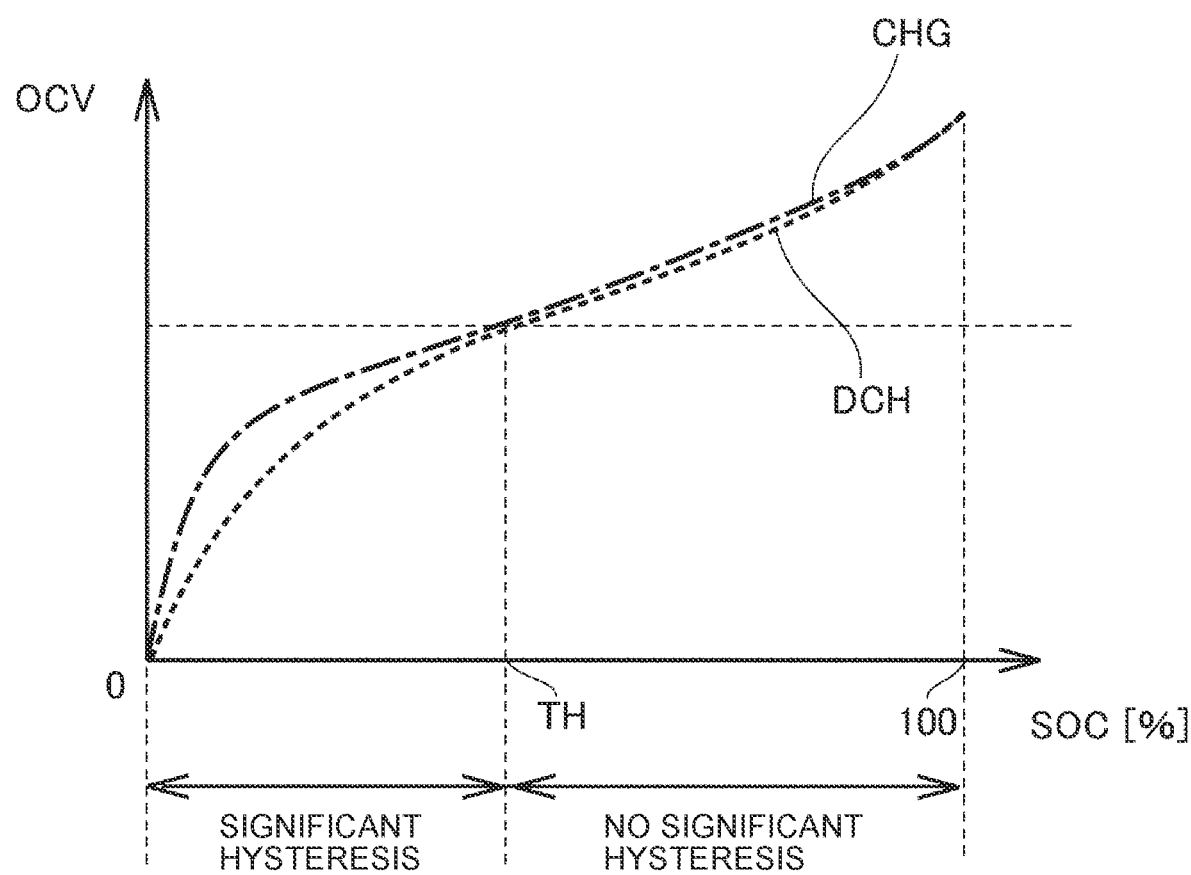
FIG. 19 is a graph for illustrating hysteresis characteristics in a third embodiment.

FIG. 19 is a view for illustrating hysteresis characteristics in the third embodiment. As shown in FIG. 19, when a composite material containing a silicon-based compound and graphite is employed, the SOC range in which the hysteresis of OCV significantly appears is limited to a low SOC range (an SOC range lower than TH in FIG. 19). The threshold TH is obtained by experiment in advance. A high SOC range (an SOC range higher than or equal to TH) corresponds to an example of a first SOC range according to the disclosure, and the low SOC range corresponds to an example of a second SOC range according to the disclosure.

Figure 20:
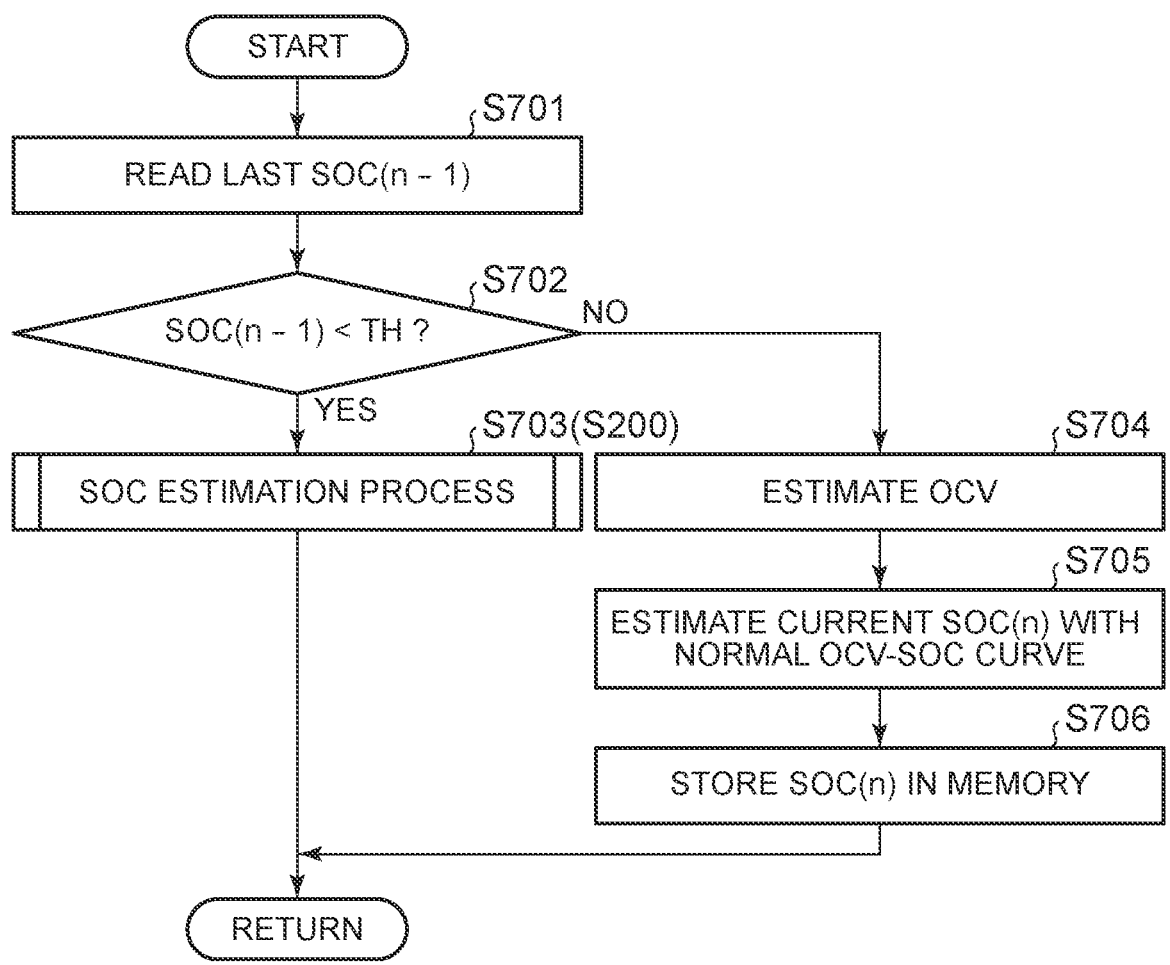
FIG. 20 is a flowchart for illustrating an SOC estimation process in the third embodiment.

FIG. 20 is a flowchart for illustrating an SOC estimation process in the third embodiment. Referring to FIG. 1 and FIG. 20, in S701, the ECU 100 reads an SOC(n−1) estimated in the last computation cycle from the memory 100B.

In S702, the ECU 100 determines whether the SOC(n−1) is lower than the threshold TH. When the SOC(n−1) is lower than the threshold TH (YES in S702), the ECU 100 executes the SOC estimation process (see FIG. 10) similar to the first embodiment (S703). Instead of the SOC estimation process in the first embodiment, the third estimation process (see FIG. 17) in the second embodiment may be executed.

In contrast, when the SOC(n−1) is higher than or equal to the threshold TH (NO in S702), the ECU 100 estimates an SOC with the use of a normal technique. Specifically, initially, the ECU 100 estimates the OCV of the battery pack 10 (S704). The ECU 100 estimates an SOC(n) in the current computation cycle from the OCV estimated in S704 with the use of the normal SOC-OCV curve of which hysteresis due to a surface stress σ is not considered (S705). The estimated SOC(n) is stored in the memory 100B, and is used in the process of S701 in the next computation process (S706).

As described above, according to the third embodiment, when a composite material is employed as the negative electrode active material, an SOC is estimated in consideration of hysteresis due to a surface stress σ in the low SOC range in which the hysteresis of OCV significantly appears. On the other hand, in the high SOC range in which no significant hysteresis appears, an SOC is estimated in accordance with a general technique. When SOC estimation in consideration of hysteresis due to a surface stress σ is compared with SOC estimation in accordance with a general technique, the former requires larger computational resource than the latter. For this reason, by using a normal technique in the high SOC range, it is possible to save the computational resource of the ECU 100.

The example of a composite material containing a silicon-based material and graphite is described with reference to FIG. 19 and FIG. 20. As long as a material exhibits significant hysteresis only in part of an SOC range, the negative electrode active material may contain the material. An example of such a material is a composite material containing a silicon-based material and lithium titanate. With this composite material, it is known that significant hysteresis appears in a high SOC range. In this case, in the processing flow shown in FIG. 20, an inequality sign in the determination process of S702 just needs to be reversed.

Fourth Embodiment

In the first to third embodiments, the SOC estimation process of the battery pack 10 is described. In the fourth embodiment, the process of determining a state of health (SOH) of the battery pack 10, more specifically, the process of calculating a full charge capacity of the battery pack 10 (full charge capacity calculation process), will be described.

Figure 21:
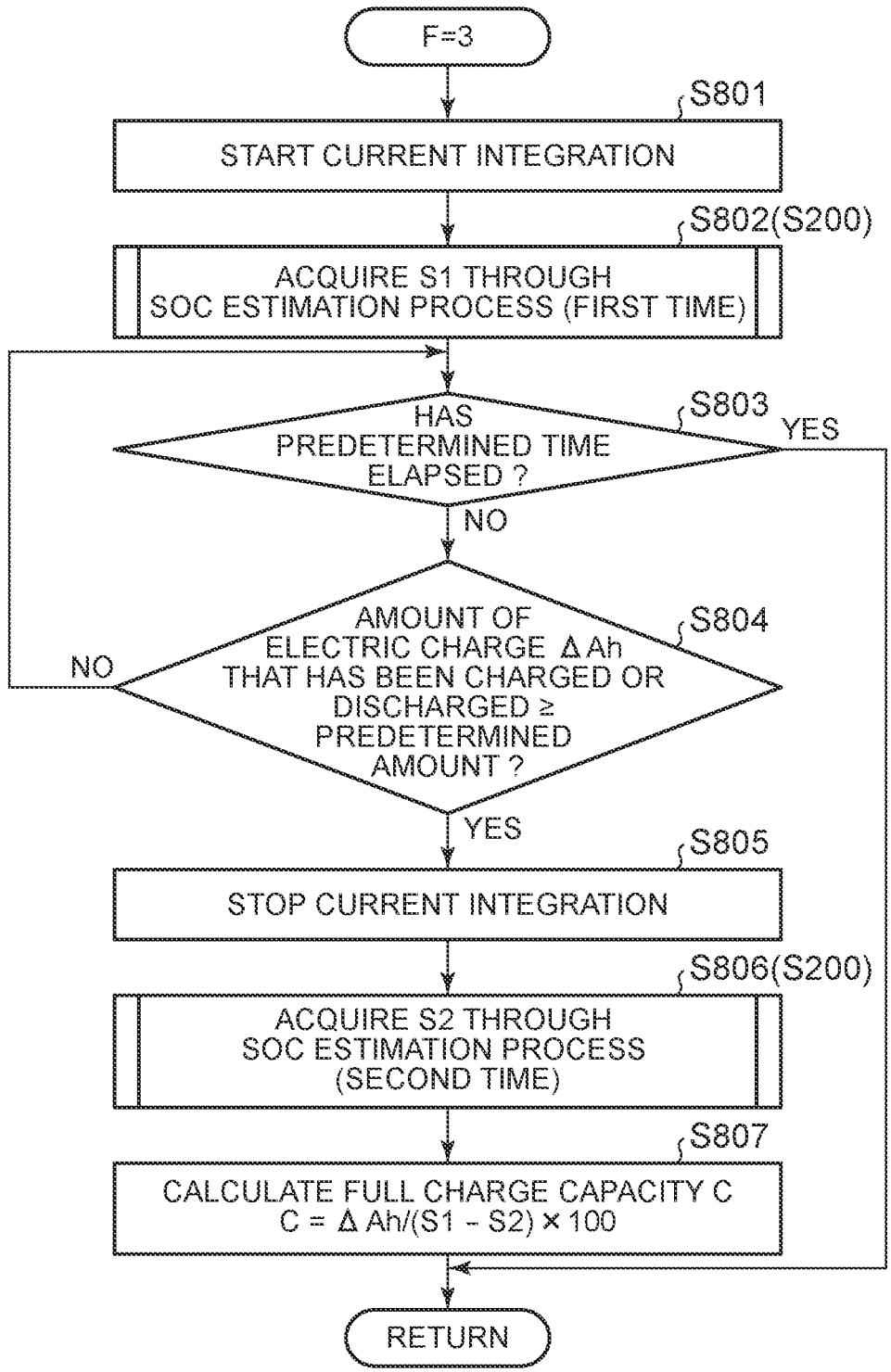
FIG. 21 is a flowchart for illustrating a full charge capacity calculation process in a fourth embodiment.

FIG. 21 is a flowchart for illustrating the full charge capacity calculation process in the fourth embodiment. Referring to FIG. 1 and FIG. 21, in S801, the ECU 100 starts current integration with the use of the current sensor 22.

In S802, the ECU 100 executes the SOC estimation process (see FIG. 10) for the first time, as in the case of the first embodiment. An SOC estimated through the SOC estimation process for the first time is denoted by S1.

If an excessively long time elapses between the SOC estimation process for the first time and an SOC estimation process for the second time (the process of S806) (described later), a detection error of the current sensor 22 accumulates, and the accuracy of calculating the amount of electric charge ΔAh that has been charged or discharged between the SOC estimation process for the first time and the SOC estimation process for the second time decreases. Therefore, in S803, the ECU 100 determines whether a time elapsed between the SOC estimation process for the first time and the SOC estimation process for the second time is a predetermined time. When a time longer than the predetermined time has elapsed (YES in S803), the process is returned to the main routine, and the series of processes is executed again from the beginning.

In order to highly accurately estimate a full charge capacity C, it is desirable that the amount of electric charge ΔAh that has been charged to or discharged from the battery pack 10 between the SOC estimation process for the first time and the SOC estimation process for the second time is large to some extent. Therefore, when the predetermined time has not elapsed (NO in S803), the ECU 100 advances the process to S804, and determines whether the amount of electric charge ΔAh that has been charged or discharged is larger than or equal to a predetermined amount (S804). As the amount of electric charge ΔAh that has been charged or discharged becomes larger than or equal to the predetermined amount (YES in S804), the ECU 100 determines that the condition for executing the SOC estimation process for the second time is satisfied, and stops current integration (S805), and then executes the SOC estimation process for the second time (S806). An SOC estimated through the SOC estimation process for the second time is denoted by S2.

One or both of the estimation process for the first time and the estimation process for the second time may be the third estimation process (see FIG. 17) in the second embodiment. As in the case of the third embodiment, SOC estimation in consideration of hysteresis due to a surface stress σ may be performed only in part of an SOC range.

In S807, the ECU 100 calculates the full charge capacity C of the battery pack 10 with the use of S1, S2, and the amount of electric charge ΔAh that has been charged or discharged. The S1 and S2 are the estimated results of the SOC estimation processes. More specifically, the full charge capacity C is calculated in accordance with the following mathematical expression (4).

$$C = \Delta Ah/(S1-S2) \times 100 \qquad (4)$$

As described above, according to the fourth embodiment, an SOC is estimated in consideration of hysteresis due to a surface stress σ, and a full charge capacity C is calculated with the use of the estimated result. Since it is possible to highly accurately estimate an SOC in consideration of the hysteresis of OCV as in the case of the first to third embodiments, it is also possible to highly accurately estimate a full charge capacity C.

In the first to fourth embodiments, the example in which a silicon-based compound is used as the negative electrode active material of which the amount of volume change resulting from charging or discharging is large is described. However, the negative electrode active material of which the amount of volume change resulting from charging or discharging is large is not limited to the silicon-based compound. In the specification, the negative electrode active material of which the amount of volume change is large means a material of which the amount of volume change is larger than the amount of volume change (approximately 10%) of graphite resulting from charging or discharging. Such a negative electrode material of a lithium ion secondary battery is a tin-based compound (Sn, SnO, or the like), a germanium (Ge)-based compound, or a lead (Pb)-based compound. The lithium ion secondary battery is not limited to a liquid system, and may be a polymer system or an all-solid system. When the amount of volume change of the positive electrode active material is large, hysteresis originated from the positive electrode may be considered.

Furthermore, a secondary battery, to which the SOC estimation process according to the disclosure is applicable, is not limited to a lithium ion secondary battery. Another secondary battery (for example, a nickel-metal hydride battery) may be employed. A surface stress can occur also at the positive electrode side of the secondary battery. Therefore, the SOC estimation process according to the disclosure may be used in order to take a surface stress at the positive electrode side of the secondary battery into consideration at the time of estimating an SOC.

The embodiments described above are illustrative and not restrictive in all respects. The scope of the disclosure is not defined by the description of the above-described embodiments, and is defined by the appended claims. The scope of the disclosure is intended to encompass all modifications within the scope of the appended claims and equivalents thereof.

What is claimed is:

1. A secondary battery system comprising:
a secondary battery including an electrode, the electrode containing an active material; and
an electronic control unit configured to execute a state of charge (SOC) estimation process of estimating SOC of the secondary battery with the use of a first correspondence relation and a second correspondence relation, the first correspondence relation being a correspondence relation between an open circuit voltage (OCV) and the SOC of the secondary battery in a case where a surface stress of the active material is a reference stress, the second correspondence relation being a correspondence relation between the surface stress and an amount of change in the OCV with reference to OCV in the case where the surface stress is the reference stress, the amount of change in the OCV being caused by the surface stress of the active material, wherein, in the SOC estimation process, the electronic control unit is configured to:
i) calculate the surface stress from a use history of the secondary battery;
ii) calculate the amount of change in the OCV from the calculated surface stress by consulting the second correspondence relation;
iii) correct an estimated OCV by using the amount of change in the OCV, the estimated OCV being estimated from a voltage value and a current value of the secondary battery;
iv) estimate SOC corresponding to the estimated OCV which is corrected as the SOC of the secondary battery by consulting the first correspondence relation; and
v) control charging and discharging of the secondary battery system in accordance with the estimated SOC.

2. The secondary battery system according to claim 1, wherein:
the electronic control unit is configured to repeatedly execute the SOC estimation process; and
the use history includes a temperature of the secondary battery, a current input to or output from the secondary battery, an amount of change in the SOC of the secondary battery, and SOC of the secondary battery estimated in a last SOC estimation process.

3. The secondary battery system according to claim 1, wherein:
the electronic control unit is configured to repeatedly execute the SOC estimation process; and
the use history includes a temperature of the secondary battery, an amount of electric charge that has been charged into or discharged from the secondary battery from a time when a combination of SOC and OCV of the secondary battery deviates from any one of a charge curve and discharge curve of the secondary battery, and SOC of the secondary battery estimated in a last SOC estimation process.

4. The secondary battery system according to claim 1, wherein:
the electronic control unit includes a memory which stores the use history; and
the electronic control unit is configured to calculate the surface stress by using the use history stored in the memory within a predetermined period from execution of the SOC estimation process.

5. The secondary battery system according to claim 1, wherein:
the active material includes a first active material and a second active material;
an amount of volume change of the second active material resulting from charging or discharging of the secondary battery is larger than an amount of volume change of the first active material resulting from charging or discharging of the secondary battery;
a first SOC range and a second SOC range exist in a correspondence relation between the OCV and the SOC of the secondary battery, hysteresis of the OCV of the secondary battery resulting from charging and discharging of the secondary battery in the second SOC range being larger than hysteresis of the OCV of the secondary battery resulting from charging and discharging of the secondary battery in the first SOC range; and
the electronic control unit is configured to:
i) repeatedly estimate the SOC of the secondary battery;
ii) when the SOC of the secondary battery, estimated last time, falls within the second SOC range, execute the SOC estimation process; and iii) when the SOC of the secondary battery, estimated last time, falls within the first SOC range, estimate the SOC of the secondary battery in accordance with a relation between the OCV and the SOC, the relation between the OCV and the SOC being other than the first correspondence relation or the second correspondence relation.

6. A state of charge (SOC) estimation method for a secondary battery including an active material in an electrode of the secondary battery, comprising:
calculating a surface stress of the active material from a use history of the secondary battery;
calculating an amount of change in an open circuit voltage (OCV) of the secondary battery from the calculated surface stress by consulting a first correspondence relation, the first correspondence relation being a correspondence relation between the surface stress and an amount of change in the OCV with reference to OCV in a case where the surface stress is a reference stress, the amount of change in the OCV being caused by the surface stress;
correcting an estimated OCV by using the amount of change in OCV, the estimated OCV being estimated from a voltage value and a current value of the secondary battery;
estimating SOC corresponding to the estimated OCV which is corrected as SOC of the secondary battery by consulting a second correspondence relation, the second correspondence relation being a correspondence relation between OCV and SOC of the secondary battery in the case where the surface stress is the reference stress; and
controlling charging and discharging of the secondary battery system in accordance with the estimated SOC.

* * * * *